(12) United States Patent
Diana et al.

(10) Patent No.: US 11,742,378 B2
(45) Date of Patent: Aug. 29, 2023

(54) HIGH DENSITY INTERCONNECT FOR SEGMENTED LEDS

(71) Applicant: Lumileds LLC, San Jose, CA (US)

(72) Inventors: Frederic Stephane Diana, San Jose, CA (US); Alan Andrew McReynolds, San Jose, CA (US)

(73) Assignee: Lumileds LLC, San Jose, CA (US)

( * ) Notice: Subject to any disclaimer, the term of this patent is extended or adjusted under 35 U.S.C. 154(b) by 0 days.

(21) Appl. No.: 17/731,822

(22) Filed: Apr. 28, 2022

(65) Prior Publication Data

US 2022/0254832 A1     Aug. 11, 2022

Related U.S. Application Data

(63) Continuation of application No. 16/230,673, filed on Dec. 21, 2018, now Pat. No. 11,355,549.

(60) Provisional application No. 62/611,999, filed on Dec. 29, 2017.

(30) Foreign Application Priority Data

Mar. 28, 2018 (EP) .................................. 18164702

(51) Int. Cl.
| | |
|---|---|
| H01L 27/15 | (2006.01) |
| H01L 33/42 | (2010.01) |
| H01L 25/075 | (2006.01) |
| H01L 33/38 | (2010.01) |
| H01L 33/62 | (2010.01) |
| H01L 33/46 | (2010.01) |
| H01L 33/00 | (2010.01) |

(52) U.S. Cl.
CPC ........ *H01L 27/156* (2013.01); *H01L 25/0753* (2013.01); *H01L 33/005* (2013.01); *H01L 33/382* (2013.01); *H01L 33/42* (2013.01); *H01L 33/62* (2013.01); *H01L 33/46* (2013.01); *H01L 2933/0016* (2013.01); *H01L 2933/0066* (2013.01)

(58) Field of Classification Search
None
See application file for complete search history.

(56) References Cited

U.S. PATENT DOCUMENTS

| | | |
|---|---|---|
| 6,037,612 A | 3/2000 | Nishimura et al. |
| 7,213,942 B2 | 5/2007 | Jiang et al. |
| 7,560,738 B2 | 7/2009 | Liu |
| 7,880,182 B2 | 2/2011 | Yao et al. |
| 8,283,682 B2 | 10/2012 | Yoon et al. |
| 8,362,506 B2 | 1/2013 | Rode et al. |
| 8,405,107 B2 | 3/2013 | Yao et al. |
| 8,723,019 B2 | 5/2014 | Kim |
| 8,785,958 B2 | 7/2014 | Yao et al. |
| 8,859,311 B2 | 10/2014 | Lee et al. |

(Continued)

FOREIGN PATENT DOCUMENTS

| | | |
|---|---|---|
| DE | 102016111113 A1 | 12/2017 |
| EP | 1553640 A1 | 7/2005 |

(Continued)

*Primary Examiner* — Bo B Jang
(74) *Attorney, Agent, or Firm* — Servilla Whitney LLC

(57) ABSTRACT

A light emitting diode (LED) may include a conductive via in a first portion of an epitaxial layer and a first contact on a second portion of the epitaxial layer. The first portion and the second portion may be separated by an isolation region. The LED may include a transparent conductive layer on the epitaxial layer.

12 Claims, 33 Drawing Sheets

(56) References Cited

U.S. PATENT DOCUMENTS

| | | |
|---|---|---|
| 9,006,775 B1 | 4/2015 | Kuo |
| 9,070,851 B2 | 6/2015 | Seo et al. |
| 9,082,947 B2 | 7/2015 | Rhee et al. |
| 9,093,629 B2 | 7/2015 | Rhee et al. |
| 9,165,977 B2 | 10/2015 | Kim et al. |
| 9,206,967 B2 | 12/2015 | Bang |
| 9,257,482 B2 | 2/2016 | Rhee |
| 9,269,698 B2 | 2/2016 | Zeng et al. |
| 9,337,394 B2 | 5/2016 | Chen et al. |
| 9,406,656 B2 | 8/2016 | Eunah et al. |
| 9,425,173 B2 | 8/2016 | Rhee |
| 9,461,209 B2 | 10/2016 | Tsai et al. |
| 9,502,389 B2 | 11/2016 | Kim |
| 9,537,048 B2 | 1/2017 | Chen et al. |
| 9,577,171 B2 | 2/2017 | Lee et al. |
| 9,627,363 B2 | 4/2017 | Kim et al. |
| 9,666,765 B2 | 5/2017 | Choi |
| 9,769,897 B2 | 9/2017 | Song et al. |
| 9,786,816 B2 | 10/2017 | Lee |
| 9,799,634 B2 | 10/2017 | Rhee |
| 9,825,067 B2 | 11/2017 | Rhee |
| 9,831,222 B2 | 11/2017 | Lee et al. |
| 9,831,387 B2 | 11/2017 | Chu et al. |
| 9,837,388 B2 | 12/2017 | Rhee |
| 9,837,389 B2 | 12/2017 | Choi |
| 9,842,764 B2 | 12/2017 | Bang |
| 9,846,510 B2 | 12/2017 | Rhee |
| 9,865,572 B2 | 1/2018 | Wi et al. |
| 9,887,180 B2 | 2/2018 | Meitl et al. |
| 9,947,835 B2 | 4/2018 | Seo et al. |
| 9,978,726 B2 | 5/2018 | Rhee et al. |
| 10,096,646 B2 | 10/2018 | Boyama et al. |
| 10,096,750 B2 | 10/2018 | Choi et al. |
| 10,147,849 B2 | 12/2018 | Xu et al. |
| 10,152,166 B2 | 12/2018 | Yun |
| 10,170,671 B2 | 1/2019 | Chu |
| 10,205,060 B2 | 2/2019 | Jeon |
| 10,276,632 B2 | 4/2019 | Lee |
| 10,278,243 B2 | 4/2019 | Song et al. |
| 10,340,257 B2 | 7/2019 | Sung et al. |
| 10,368,417 B2 | 7/2019 | Kim et al. |
| 10,424,500 B2 | 9/2019 | Chang et al. |
| 10,770,631 B2 | 9/2020 | Kim et al. |
| 10,797,188 B2 | 10/2020 | Chu |
| 10,910,350 B2 | 2/2021 | Chu et al. |
| 10,950,583 B2 | 3/2021 | Mnon |
| 2005/0224822 A1 | 10/2005 | Liu |
| 2005/0254243 A1 | 11/2005 | Jiang et al. |
| 2007/0284598 A1 | 12/2007 | Shakuda |
| 2009/0302334 A1 | 12/2009 | Yao et al. |
| 2010/0230698 A1 | 9/2010 | Rode et al. |
| 2011/0089444 A1 | 4/2011 | Yao et al. |
| 2011/0215346 A1 | 9/2011 | Yoon et al. |
| 2012/0074441 A1 | 3/2012 | Seo et al. |
| 2012/0111395 A1 | 5/2012 | Kim |
| 2012/0126259 A1 | 5/2012 | Mizutani et al. |
| 2013/0105845 A1 | 5/2013 | Kim et al. |
| 2013/0207135 A1 | 8/2013 | Yao et al. |
| 2014/0061700 A1 | 3/2014 | Lee et al. |
| 2014/0070245 A1 | 3/2014 | Haberern et al. |
| 2014/0291708 A1 | 10/2014 | Zeng et al. |
| 2015/0054008 A1 | 2/2015 | Rhee |
| 2015/0108492 A1 | 4/2015 | Kuo |
| 2015/0115296 A1 | 4/2015 | Rhee et al. |
| 2015/0116985 A1 | 4/2015 | Bang |
| 2015/0144974 A1 | 5/2015 | Chen et al. |
| 2015/0144984 A1 | 5/2015 | Chen et al. |
| 2015/0171297 A1 | 6/2015 | Rhee et al. |
| 2015/0255439 A1 | 9/2015 | Kim |
| 2015/0340346 A1 | 11/2015 | Chu et al. |
| 2015/0359056 A1 | 12/2015 | Song et al. |
| 2015/0362165 A1 | 12/2015 | Chu et al. |
| 2016/0005789 A1 | 1/2016 | Rhee |
| 2016/0005941 A1 | 1/2016 | Tsai et al. |
| 2016/0013388 A1 | 1/2016 | Lee et al. |
| 2016/0020353 A1 | 1/2016 | Chu |
| 2016/0043061 A1 | 2/2016 | Rhee |
| 2016/0111601 A1 | 4/2016 | Lee et al. |
| 2016/0126224 A1 | 5/2016 | Lee et al. |
| 2016/0190105 A1 | 6/2016 | Rhee et al. |
| 2016/0218142 A1 | 7/2016 | Bang |
| 2016/0240517 A1 | 8/2016 | Kim et al. |
| 2016/0254253 A1 | 9/2016 | Meitl et al. |
| 2016/0293805 A1 | 10/2016 | Choi |
| 2016/0300745 A1 | 10/2016 | Chang et al. |
| 2016/0313848 A1 | 10/2016 | Rhee |
| 2016/0315068 A1 | 10/2016 | Lee et al. |
| 2016/0342233 A1 | 11/2016 | Lee et al. |
| 2016/0349903 A1 | 12/2016 | Yun |
| 2017/0012026 A1 | 1/2017 | Choi |
| 2017/0047484 A1 | 2/2017 | Kuo et al. |
| 2017/0062675 A1 | 3/2017 | Lim et al. |
| 2017/0071042 A1 | 3/2017 | Song et al. |
| 2017/0077173 A1 | 3/2017 | Boyama et al. |
| 2017/0117257 A1 | 4/2017 | Lee et al. |
| 2017/0133549 A1 | 5/2017 | Xu et al. |
| 2017/0170151 A1 | 6/2017 | Rhee et al. |
| 2017/0170152 A1 | 6/2017 | Wi et al. |
| 2017/0170364 A1 | 6/2017 | Jeon |
| 2017/0200765 A1 | 7/2017 | Choi et al. |
| 2017/0207249 A1 | 7/2017 | Rhee |
| 2017/0236979 A1 | 8/2017 | Seo et al. |
| 2017/0345802 A1 | 11/2017 | Sung et al. |
| 2017/0365755 A1 | 12/2017 | Chu |
| 2018/0138235 A1 | 5/2018 | Lee |
| 2018/0192495 A1 | 7/2018 | Kim et al. |
| 2018/0240937 A1 | 8/2018 | Park et al. |
| 2018/0277524 A1 | 9/2018 | Moon et al. |
| 2019/0206926 A1 | 7/2019 | Diana et al. |
| 2020/0083415 A1 | 3/2020 | Kim et al. |
| 2020/0235077 A1 | 7/2020 | Jeon et al. |
| 2021/0110762 A1 | 4/2021 | Pan |
| 2021/0125971 A1 | 4/2021 | Chu et al. |
| 2021/0273413 A1 | 9/2021 | Park et al. |

FOREIGN PATENT DOCUMENTS

| | | |
|---|---|---|
| JP | H11163400 A | 6/1999 |
| JP | 2012114184 A | 6/2012 |
| TW | I240436 B | 9/2005 |
| TW | I244771 B | 12/2005 |
| WO | 2015054029 A1 | 4/2015 |

HIGH DENSITY INTERCONNECT FOR SEGMENTED LEDS

CROSS REFERENCE TO RELATED APPLICATIONS

This application is a Continuation of U.S. application Ser. No. 16/230,673, filed on Dec. 21, 2018, which claims the benefit of U.S. Provisional Application No. 62/611,999, filed on Dec. 29, 2017 and European Patent Application No. 18164702.5, filed on Mar. 28, 2018, the contents of which are hereby incorporated by reference herein.

BACKGROUND

The present disclosure generally relates to manufacture of high density interconnects for densely packed or segmented light emitting diodes or lasers. Transparent conductive oxides may provide some of the interconnects.

SUMMARY

A light emitting diode (LED) may include a conductive via in a first portion of an epitaxial layer and a first contact on a second portion of the epitaxial layer. The first portion and the second portion may be separated by an isolation region. The LED may include a transparent conductive layer on the epitaxial layer.

BRIEF DESCRIPTION OF THE DRAWINGS

A more detailed understanding can be had from the following description, given by way of example in conjunction with the accompanying drawings wherein:

FIG. 1O shows another embodiment of a segmented LED with a high-density interconnect system without a wirebond;
FIG. 1AA shows an LED array;
FIG. 1AB shows another LED array;
FIG. 1AC shows another LED array;
FIG. 1AD shows another LED array;
FIG. 1AE shows another LED array;
FIG. 1AF shows another LED array;
FIG. 1AG shows a number of LED arrays;
FIG. 1AH shows another example of the LED;
FIG. 1AI is a flowchart illustrating a method of forming a device.

DETAILED DESCRIPTION

Figure 1A:
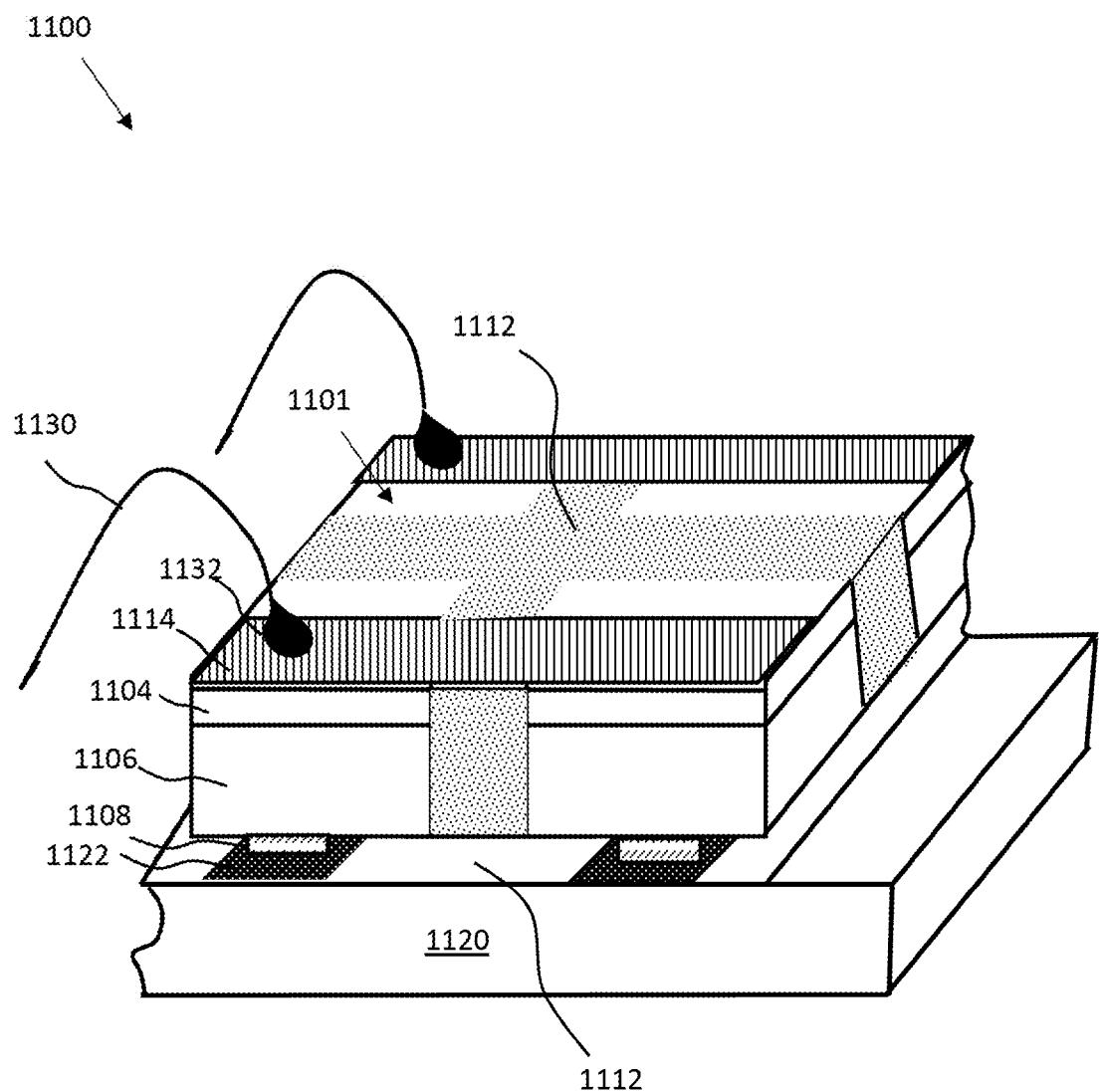
FIG. 1A illustrates one embodiment of a segmented light emitting diode (LED) with a high-density interconnect system including a wirebond.
Figure 1B:
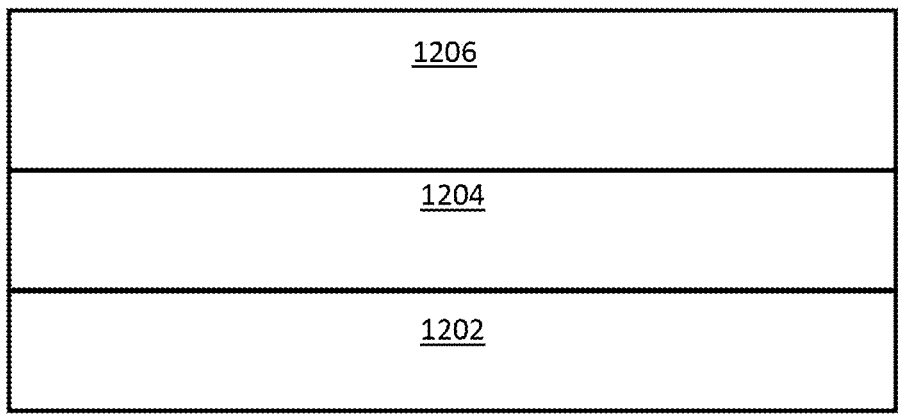
FIG. 1B shows forming an epitaxial layer on a substrate.

Examples of different light illumination systems and/or light emitting diode implementations will be described more fully hereinafter with reference to the accompanying drawings. These examples are not mutually exclusive, and features found in one example may be combined with features found in one or more other examples to achieve additional implementations. Accordingly, it will be understood that the examples shown in the accompanying drawings are provided for illustrative purposes only and they are not intended to limit the disclosure in any way. Like numbers refer to like elements throughout.

It will be understood that, although the terms first, second, third, etc. may be used herein to describe various elements, these elements should not be limited by these terms. These terms may be used to distinguish one element from another. For example, a first element may be termed a second element and a second element may be termed a first element without departing from the scope of the present invention. As used herein, the term "and/or" may include any and all combinations of one or more of the associated listed items.

It will be understood that when an element such as a layer, region, or substrate is referred to as being "on" or extending "onto" another element, it may be directly on or extend directly onto the other element or intervening elements may also be present. In contrast, when an element is referred to as being "directly on" or extending "directly onto" another element, there may be no intervening elements present. It will also be understood that when an element is referred to as being "connected" or "coupled" to another element, it may be directly connected or coupled to the other element and/or connected or coupled to the other element via one or more intervening elements. In contrast, when an element is referred to as being "directly connected" or "directly coupled" to another element, there are no intervening elements present between the element and the other element. It will be understood that these terms are intended to encompass different orientations of the element in addition to any orientation depicted in the figures.

Relative terms such as "below," "above," "upper,", "lower," "horizontal" or "vertical" may be used herein to describe a relationship of one element, layer, or region to another element, layer, or region as illustrated in the figures. It will be understood that these terms are intended to encompass different orientations of the device in addition to the orientation depicted in the figures.

Semiconductor light emitting devices or optical power emitting devices, such as devices that emit ultraviolet (UV) or infrared (IR) optical power, are among the most efficient light sources currently available. These devices may include light emitting diodes, resonant cavity light emitting diodes, vertical cavity laser diodes, edge emitting lasers, or the like (hereinafter referred to as "LEDs"). Due to their compact size and lower power requirements, for example, LEDs may be attractive candidates for many different applications. For example, they may be used as light sources (e.g., flash lights and camera flashes) for hand-held battery-powered devices, such as cameras and cell phones. They may also be used, for example, for automotive lighting, heads up display (HUD) lighting, horticultural lighting, street lighting, torch for video, general illumination (e.g., home, shop, office and studio lighting, theater/stage lighting and architectural lighting), augmented reality (AR) lighting, virtual reality (VR) lighting, as back lights for displays, and IR spectroscopy. A single LED may provide light that is less bright than an incandescent light source, and, therefore, multi-junction devices or arrays of LEDs (such as monolithic LED arrays, micro LED arrays, etc.) may be used for applications where more brightness is desired or required.

Semiconductor light-emitting devices can be arranged or formed in densely packed groups or blocks. However, when a light-emitting is small, or many light-emitting devices are grouped together, providing reliable interconnections is difficult, particularly if each light-emitting device must be separately addressable.

In accordance with embodiments of the invention, a segmented LED interconnect system includes a plurality of LED segments, each segment having a p-layer positioned on a n-layer. An optically transparent conductive line is attached to multiple n-layers of multiple LED segments, and a conductive line is attached to multiple p-layers of multiple LED segments. A wire bond can be connected to the optically transparent conductive line. In various embodiments, each LED segment can be addressably connected using a crossbar or other suitable electrical connection scheme that allows selective light emission from single or multiple LED segments in definable patterns.

In another embodiment, a method of manufacturing a segmented LED interconnect system includes the steps of sequentially growing an n-layer and a p-layer on a substrate. Channels are etched through the p-layer and the n-layer to the substrate to define multiple LED segments. Electrical contacts are defined on the p-layer are attached to a PCB substrate, which may be a LED device attach region 318 as described below, followed by removal of the substrate. Optically transparent conductive lines connected to multiple n-layers of multiple LED segments, and the optically transparent conductive lines are connected to the PCB substrate.

As seen in FIG. 1A, a segmented LED interconnect system 1100 includes a plurality of LED segments 1101 (i.e, a light emitting pixel array) separated from each other by a dielectric material 1112. Each LED segment 1101 has a p-layer 1106 positioned on a n-layer 1104 to together define an active region capable of emitting light in response to an applied electrical current. To provide needed electrical connections, optically transparent conductive lines 1114 are attached to the multiple n-layers 1104 of multiple LED segments 1101, with the optically transparent conductive lines 1114 extending across multiple LED segments and on top of the dielectric material 1112. A conductive line 1122 formed on a printed circuit board (PCB) substrate 1120 is attached to a conductive pad 1108 formed on each p-layer 1106, providing an electrical connection to multiple p-layers 1106 of the multiple LED segments 1101. A wire bond 1130 is connected to the optically transparent conductive line 1114 to allow formation of an electrical circuit passing through the p-layer 1106 and n-layer 1104.

Each of the plurality of LED segments can be sized to laterally extend between 25 and 1000 microns, or more typically, between 50 and 500 microns, with channels separating the segments being filled with an optically and electrically isolating dielectric material 1112. LED segments can have a square, rectangular, polygonal, circular, arcuate or other surface shape. Channels can be of uniform width and length, or can vary as needed. Pixel arrays of the LED segments can be arranged in geometrically straight rows and columns, staggered rows or columns, curving lines, or semi-random or random layouts. Single or multiple lines of LED segments are also supported. In some embodiments, radial or other non-rectangular grid arrangements of conductive lines to the LED segments can be used. In other embodiments, curving, winding, serpentine, and/or other suitable non-linear arrangements of conductive lines to the LED segments can be used.

FIG. 1B-G illustrate process steps for manufacture of an embodiment. As seen with respect to FIG. 1B, a substrate 1202, typically formed of sapphire or silicon carbide, supports an epitaxially grown or deposited semiconductor n-layer 1204. A semiconductor p-layer 1206 is sequentially grown or deposited on the n-layer 1204, forming an active region at the junction between layers. Semiconductor materials capable of forming high-brightness light emitting devices can include, but are not limited to, Group III-V semiconductors, particularly binary, ternary, and quaternary alloys of gallium, aluminum, indium, and nitrogen, also referred to as III-nitride materials. Such semiconductor materials can be grown to support both LED and laser systems as necessary.

Figure 1C:
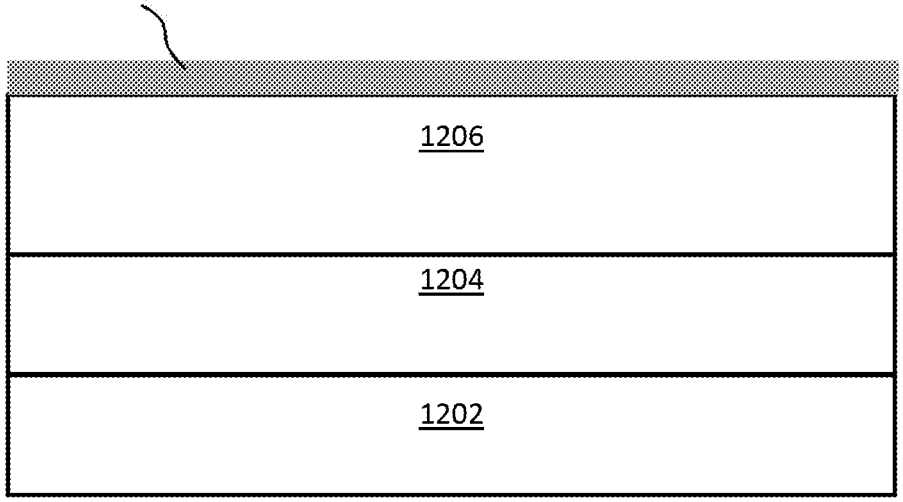
FIG. 1C shows forming a patterning layer on the epitaxial layer.
Figure 1D:
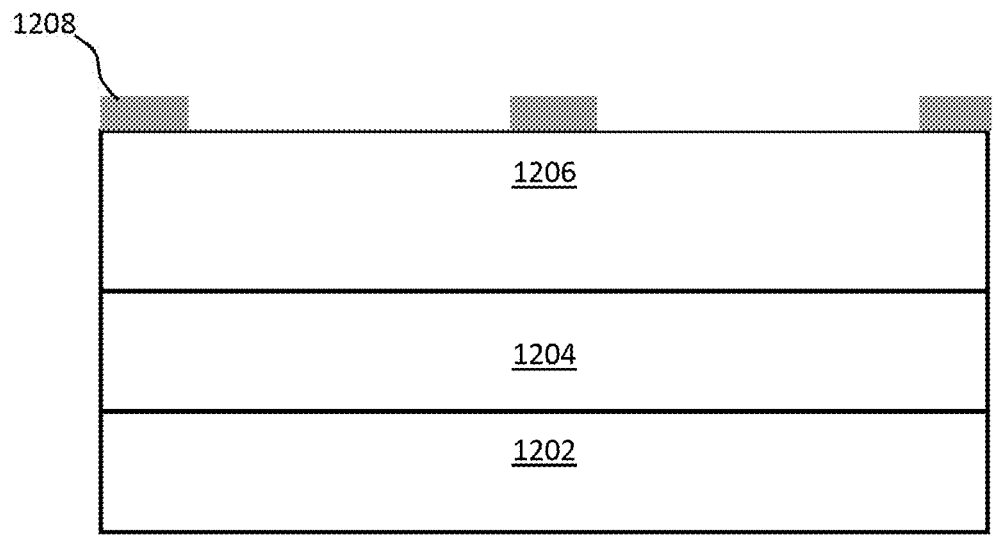
FIG. 1D shows exposing surfaces of the epitaxial layer.
Figure 1E:
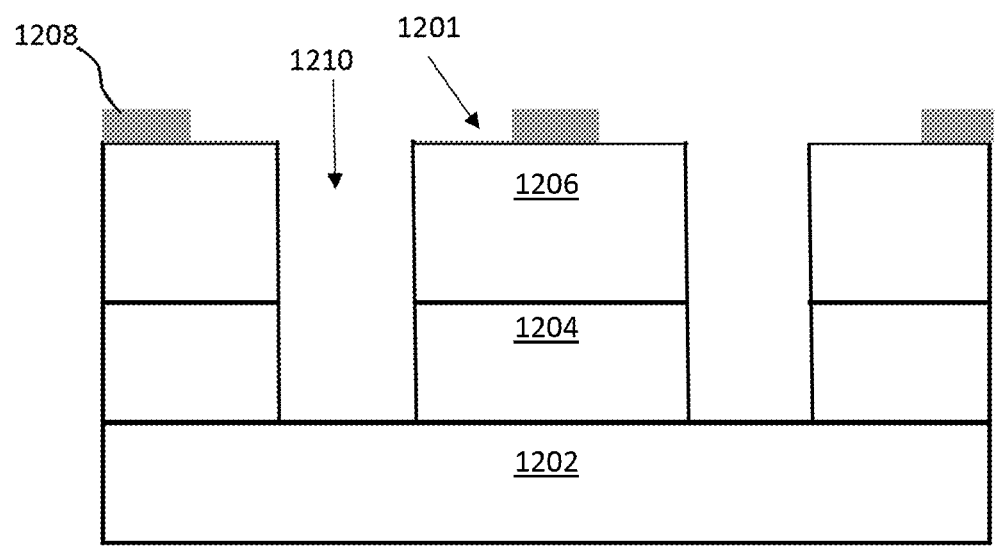
FIG. 1E shows forming trenches in the epitaxial layer.
Figure 1F:
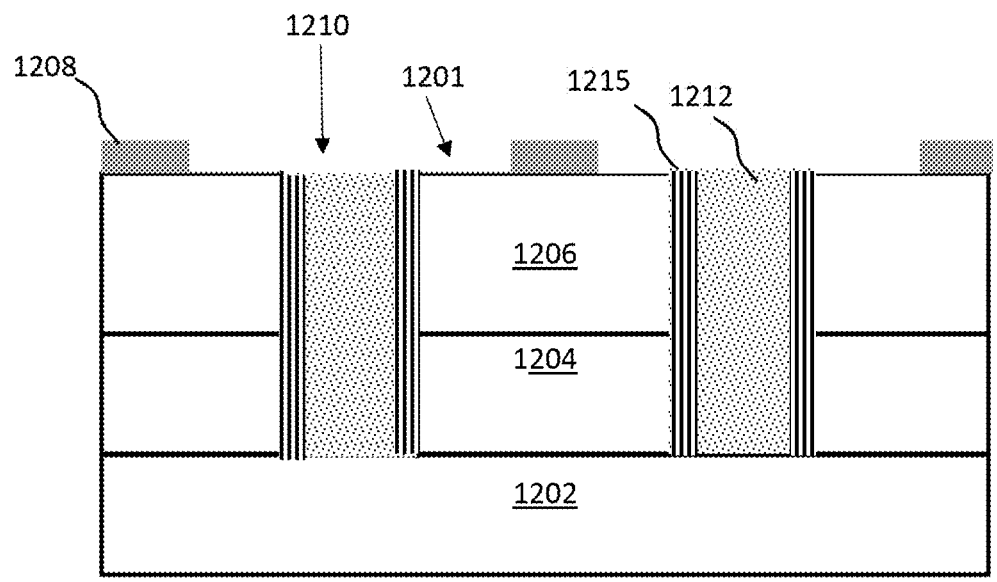
FIG. 1F shows filling the trenches.

FIG. 1C illustrates deposition of a metallic conductive layer 1207 in contact with the p-layer 1206. The metal can be deposited by evaporation or other suitable deposition process, and can include an aluminum/gold bilayer, silver, or other solderable and conductive material. As seen in FIG. 1D, selective masking and etching, or alternatively, direct patterned etching, can be used to define electrical contacts 1208 on the p-layer. As seen in FIG. 1E, a second round of selective masking and etching, or alternatively, direct patterned etching, can be used to define channels 1210 through both the p-layer 1206 and n-layer 1204 to the substrate 1202. The remaining material between the etched channels in turn defines LED segments 1201. In FIG. 1F, sidewalls 1215 of the channels 1210 are optionally coated with light absorbers, reflectors (including stack of dielectric layers that form a distributed Bragg reflector), other optical coating, or electrically insulative material. The channel 1210 is then filled with an optically and electrically isolating dielectric material 1212 that can include organic, inorganic, or organic/inorganic binder and filler material. For example, acrylate or nitrocellulose can be used in conjunction with ceramic particles. Another organic/inorganic binder and filler can be, for example, epoxy with embedded reflective titanium oxide or other reflective/scattering particles. Inorganic binders can include sol-gel (e.g., a sol-gel of TEOS or MTMS) or liquid glass (e.g., sodium silicate or potassium silicate), also known as water glass. In some embodiments binders can include fillers that adjust physical properties. Fillers can include inorganic nanoparticles, silica, glass particles or fibers, or other materials able to improve optical or thermal performance.

Figure 1G:
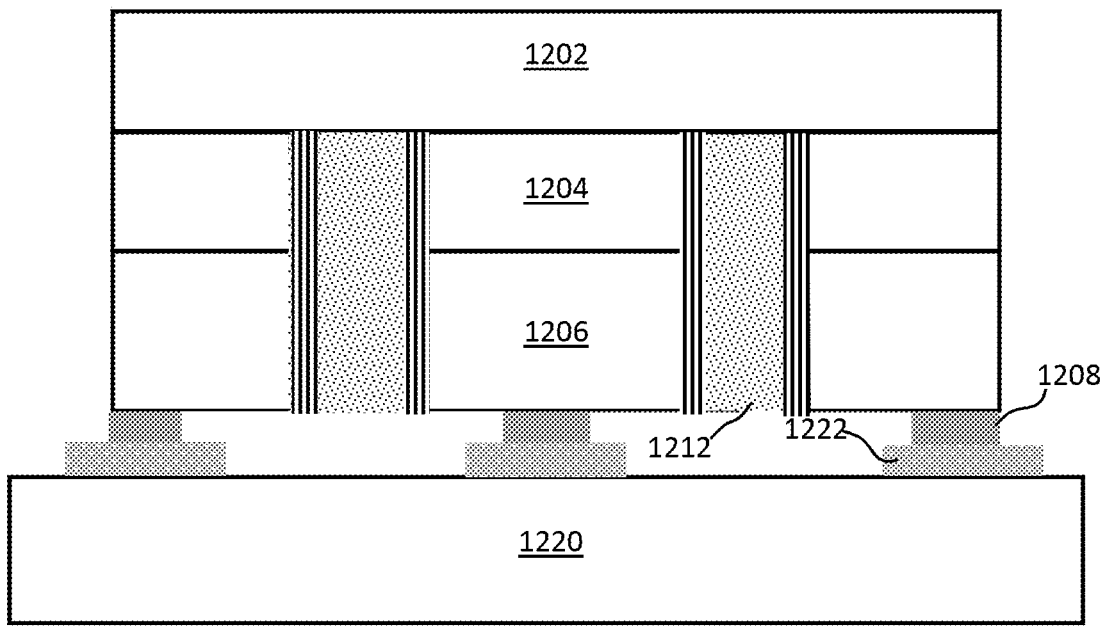
FIG. 1G shows mounting the epitaxial layer to a base.

In FIG. 1G, the structure is inverted and attached (after heating and reflow) using electrical contacts 1208 to a printed circuit board (PCB) substrate 1220. The PCB substrate supports conductive lines 1222 that extend between each LED segment and suitable electric power and drive circuitry (not shown) that is also positionable on the PCB substrate 1220.

Figure 1H:
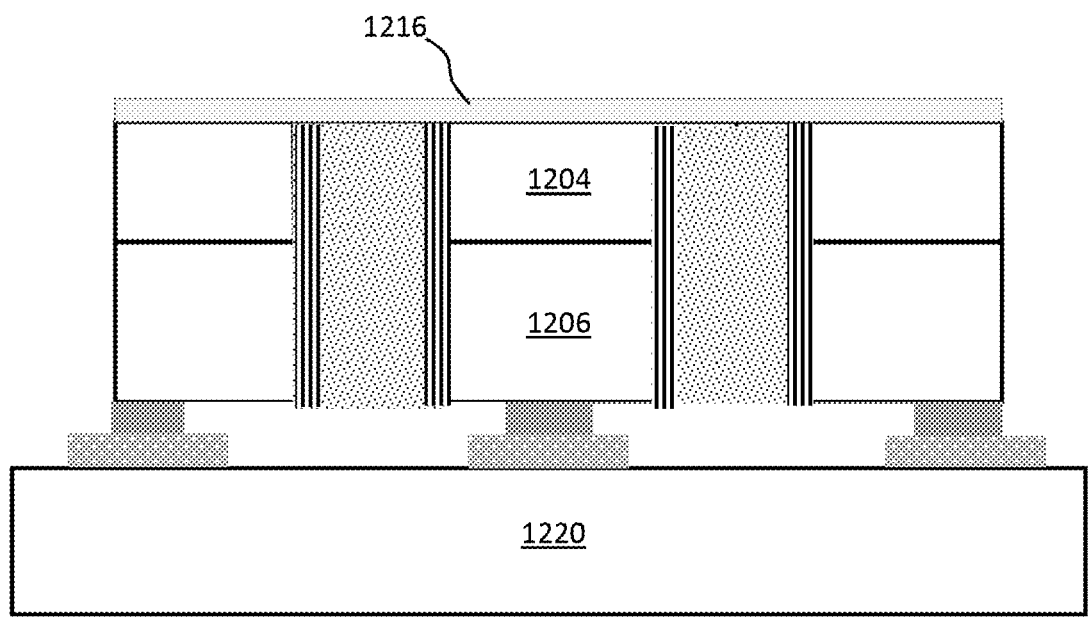
FIG. 1H shows forming a transparent conductive layer on the epitaxial layer.
Figure 1I:
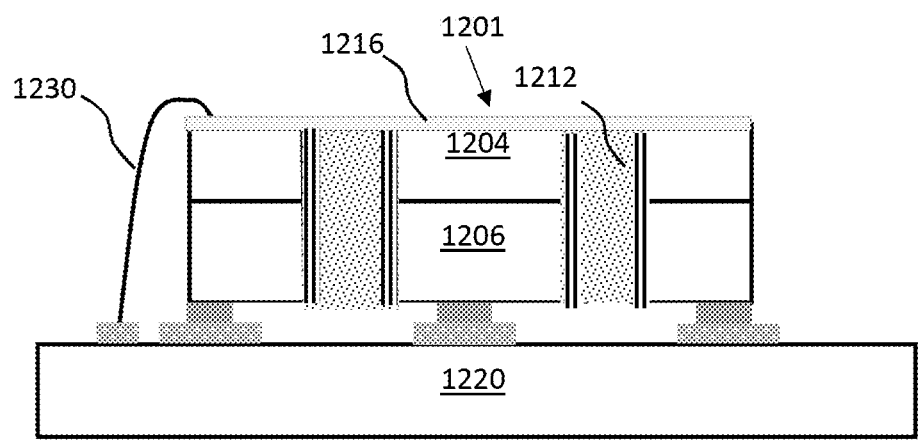
FIG. 1I shows forming a wirebond on the transparent conductive layer.

In FIG. 1H, laser liftoff or other epitaxial film separation processes is applied to remove the sapphire substrate 1202 (not shown). Polishing or photo electrochemical etching could be applied to modify surface and optical properties of the n-layer 1204 for each LED segment. When the surface of n-layer 1204 is readied, transparent conductive lines 1216 of a transparent conductor such as antimony tin oxide (ATO), indium tin oxide (ITO), silver nanowires, or doped conductive graphene are deposited. Each grouping of transparent conductor can be deposited in separate, distinct lines, strings, pads, or blocks. Complex curved, circular, or winding layouts are possible. In the next step seen in FIG. 1I, a wirebond 1230 is used to attach at least some of the transparent conductive lines 1216 to the PCB substrate 1220. In other embodiments, a separate PCB substrate (not shown) can be connected to, as well as other suitable interposers or electrically conductive boards.

As will be appreciated, various additions other modifications to the above-described LED architecture and process are possible. LED segments can be overlain with wavelength converting materials such as phosphors, quantum dots, or dyes. Multiple types and thicknesses of phosphors can be used. An LED combined with one or more wavelength converting materials may be used to create white light or monochromatic light of other colors. All or only a portion of the light emitted by the LED segment may be converted by the wavelength converting material. Unconverted light may be part of the final spectrum of light, though it need not be. Examples of common devices include a blue-emitting LED segment combined with a yellow-emitting phosphor, a blue-emitting LED segment combined with green- and red-emitting phosphors, a UV-emitting LED segment combined with blue- and yellow-emitting phosphors, and a UV-emitting LED segment combined with blue-, green-, and red-emitting phosphors. The phosphors can be electrophoretically deposited on an LED segment with application of a voltage to a particular transparent conductor string. Varying applied voltage duration will correspondingly vary amount and thickness of deposited phosphors. Alternatively, the LED segment can be coated with the phosphor, using an organic binder to adhere the phosphor particles to the LED. Phosphors can be dispensed, screen printed, sprayed, molded, or laminated. Alternatively, for certain applications, a phosphor contained in glass, or a pre-formed sintered ceramic phosphor can be attached to the LED.

In some embodiments, microlenses or other primary or secondary optical elements (including reflectors, scattering elements, or absorbers) may be attached to each LED segment or associated phosphor. In other embodiments, a primary optic can be positioned over the entire array of LED segments, and directly attached or mounted at a distance from the LED segments in suitable packaging. Protective layers, transparent layers, thermal layers, or other packaging structures can be used as needed for specific applications.

Figure 1J:
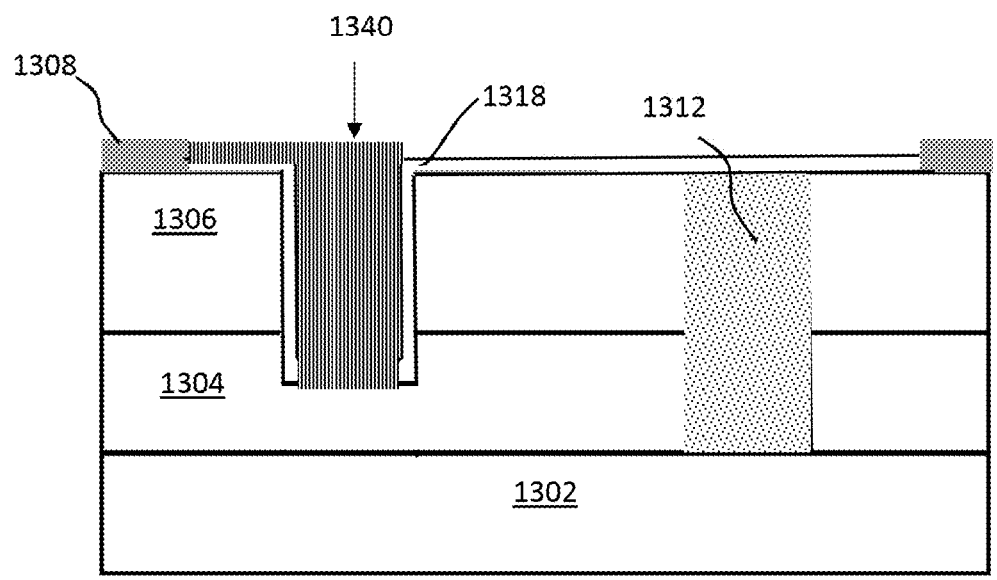
FIG. 1J shows forming an isolation region and a conductive via.
Figure 1K:
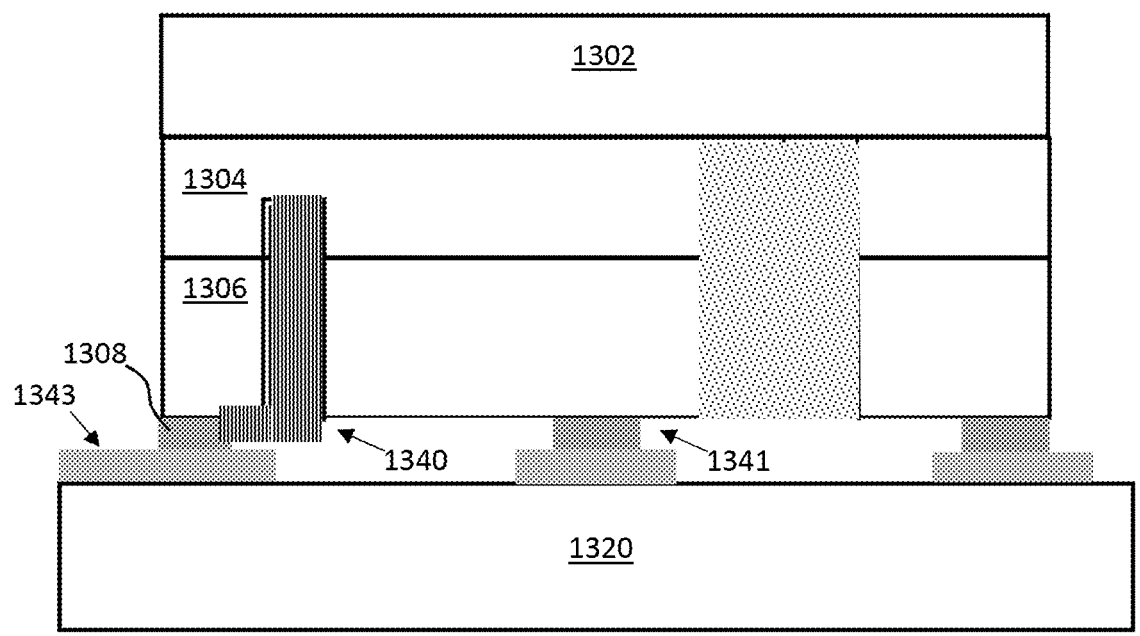
FIG. 1K shows mounting the epitaxial layer to a base.

FIGS. 1J and 1K illustrate an alternative process and structure embodiment that shares processing details discussed with respect to FIGS. 1B-1E. However, during the etch step to define channels, in the embodiment of FIG. 1J, a blind via 1340 extending through the p-layer 1306 and into the n-layer 1304 is etched, stopping before reaching the substrate 1302. Sidewalls of the via can be coated with silicon dioxide or other suitable electrical insulator 1318, with the bottom of the channel remaining exposed. The blind via is filled with an electrically conductive metal that provides contact between the exposed n-layer 1304 and previously formed conductive pad 1308. As seen with respect to FIG. 1K, this allows the structure to be inverted and attached to PCB substrate 1320 using supported conductive lines 1343 and n-contact conductive pad 1308. Also attached are p-contact conductive pad 1341, allowing addressable electrical activation of the LED segment. Advantageously, use of the blind via 1340 allows for complete or partial retention of the sapphire substrate, since wirebond connections to the top of the n-layer 1304 are not necessary.

Figure 1L:
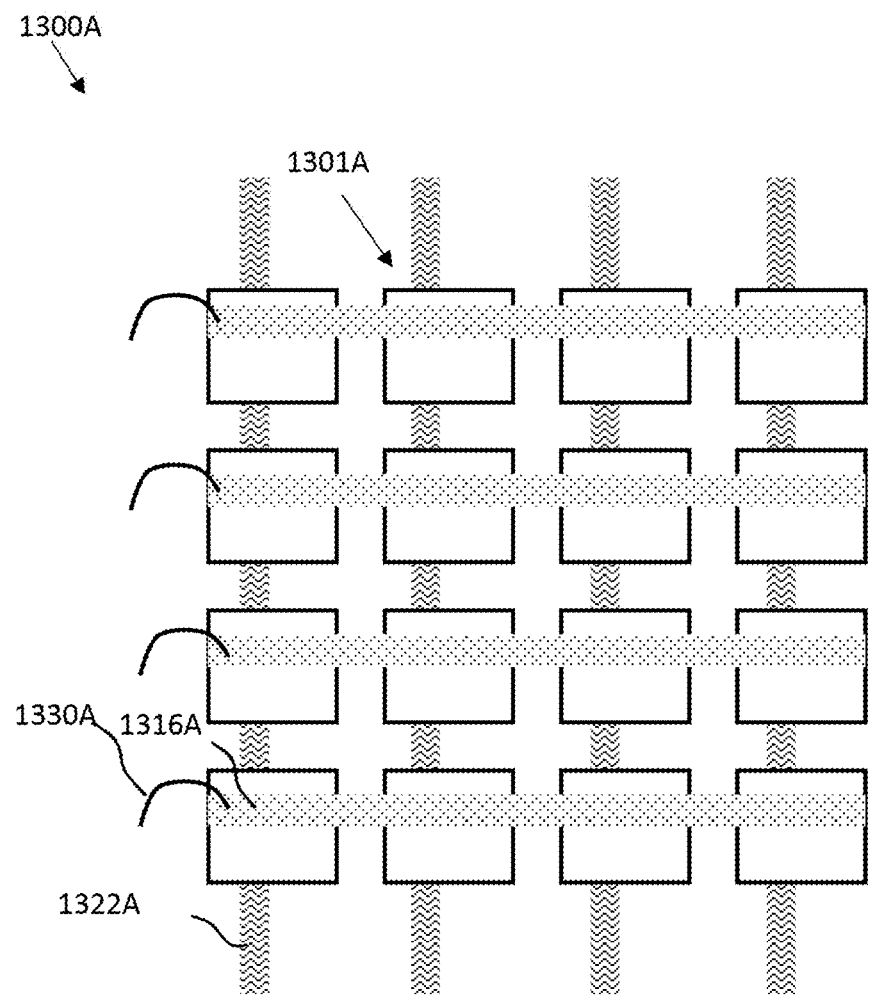
FIG. 1L shows an LED array.

FIG. 1L illustrates one layout embodiment 1300A for top and bottom conductive lines extending to LED segments arranged in a pixel array. Conductive lines 1322A can be laid out as columns, with each LED segment 1301A being connected. Transparent conductive lines 1316A can be laid out to extend over rows of LEDs segments, with a connection to a PCB substrate made with wire bonds 1330A or other suitable electrical contact or trace. Together, conductive lines 1322A and 1316A form a crossbar allowing activation (addressing) of selected pixels, lines of pixels, or blocks of pixels.

Figure 1M:
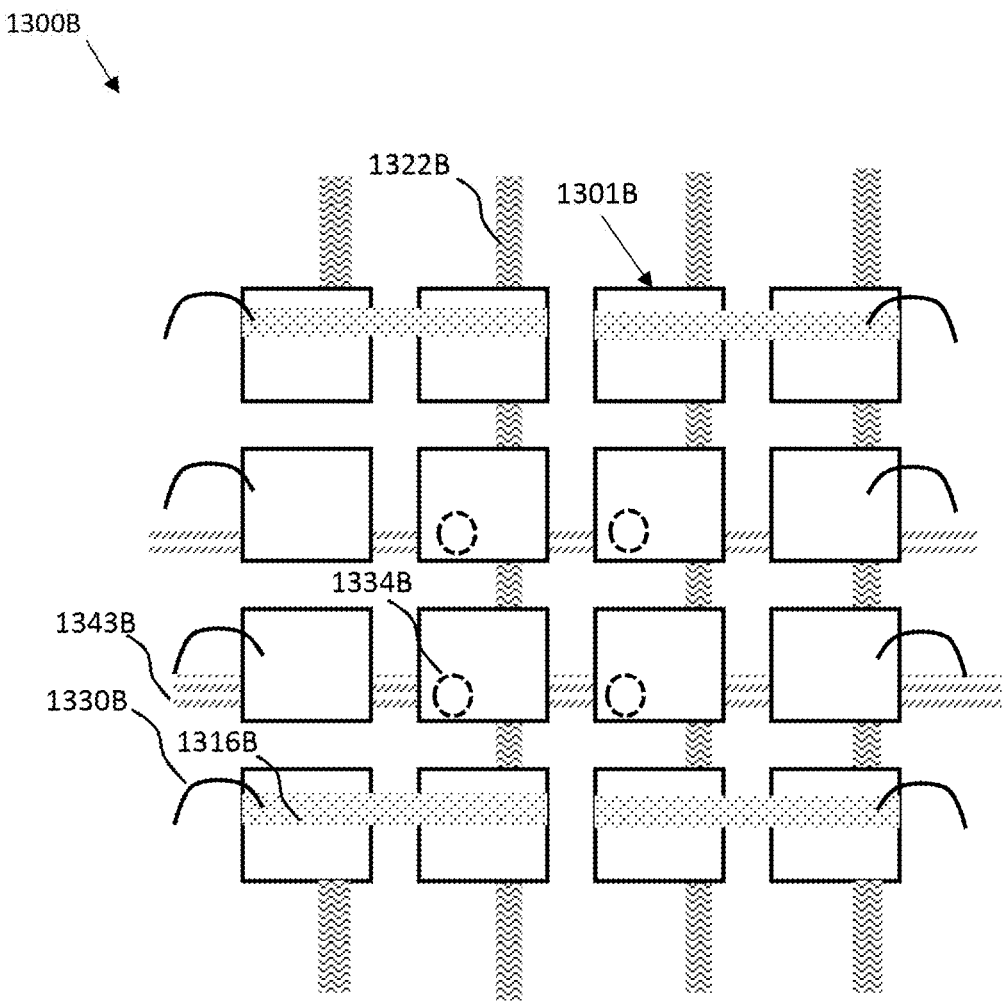
FIG. 1M shows another LED array.

FIG. 1M illustrates another layout embodiment 1300B for top and bottom conductive lines extending to LED segments arranged in a pixel array. Conductive lines 1322B can be laid out as columns, with each LED segment 1301B being connected. Transparent conductive lines 1316B can be laid out to extend over at least a portion of a row of LEDs segments, with a connection to a PCB substrate made with wire bonds 1330B or other suitable electrical contact or trace. Row conductive lines 1343B can be connected to buried via n-contacts 1334B. Advantageously, this allows n-contacts of LED segments positioned on an edge of the pixel array to be connected via wirebonds, while the internally situated LED segments that would be difficult to wirebond can be connected by the buried n-contacts 1334B.

Figure 1N:
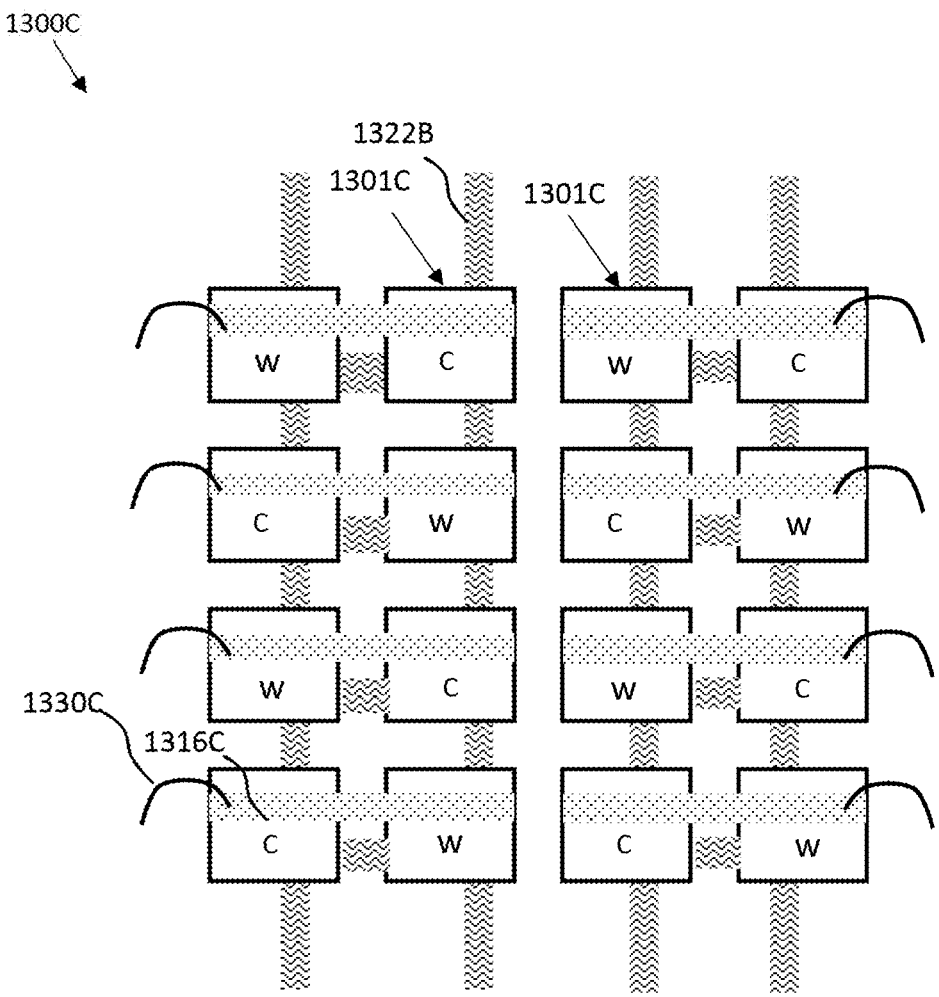
FIG. 1N shows another LED array.
Figure 10:
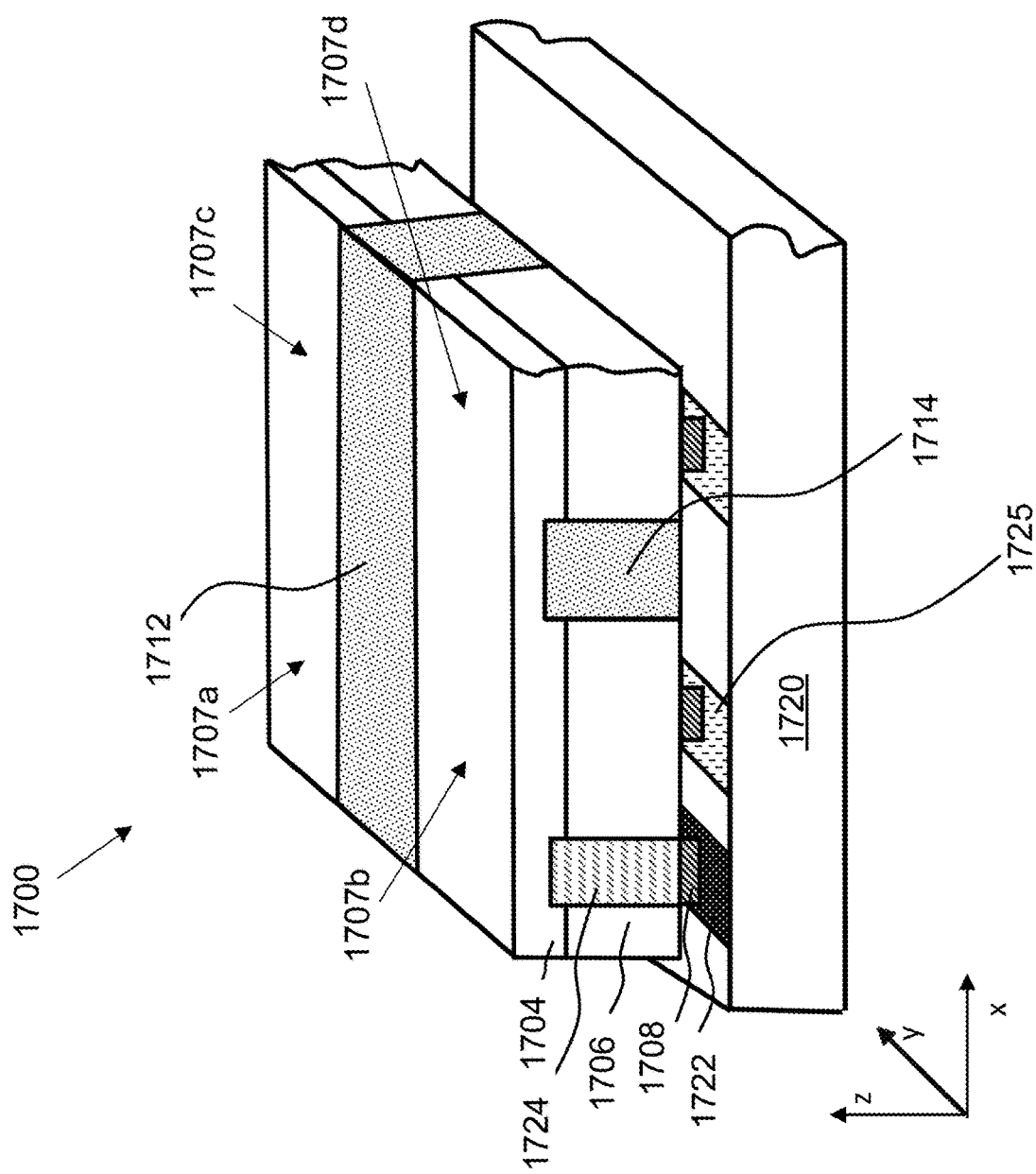
Figure 1P:
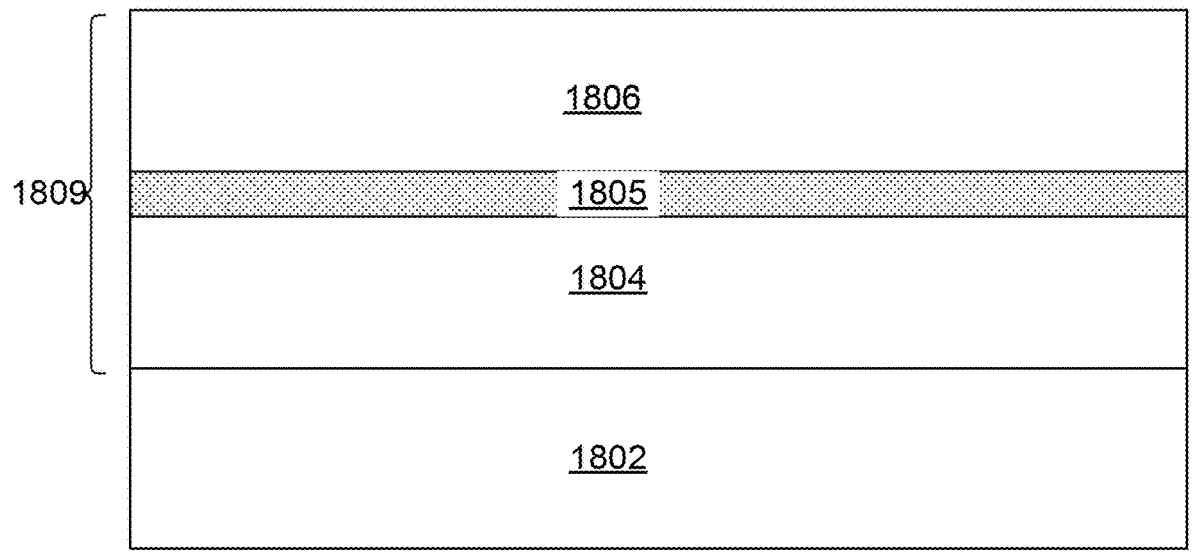
FIG. 1P shows forming an epitaxial layer on a substrate.

FIG. 1N illustrates another layout embodiment 1300C for top and bottom conductive lines extending to LED segments having alternating white (W) and colored (C) phosphors arranged in a pixel array. Each pair of white and colored LED segment can be interconnected so that both are simultaneously activatable to emit light. Conductive lines 1322C can be laid out as columns, with each LED segment 1301C being connected. Transparent conductive lines 1316C can be laid out to extend over at least a portion of a row of LEDs segments, with a connection to a PCB substrate made with wire bonds 1330C or other suitable electrical contact or trace. Advantageously, in some embodiments this allows operation using AC current.

Referring now to FIG. 1O, a perspective view of a segmented LED 1700 is shown. The segmented LED emitter 1700 may include a first pixel 1707a, a second pixel 1707b, a third pixel 1707c, and a fourth pixel 1707d (i.e., "LED segments"). The first pixel 1707a may be separated from the second pixel 1707b by a first dielectric filled channel 1712. The third pixel 1707c and the fourth pixel 1707d may be separated by the first dielectric channel 1712.

The pixels may have a p-type layer 1706 positioned on a n-type layer 1704 to together define an active region capable of emitting light in response to an applied electrical current. The first dielectric filled channel 1712 may extend through the entire n-type layer 1704 and the entire p-type layer 1706 in the x direction to electrically isolate the first pixel 1707a and the second pixel 1707b in that direction. In the y direction, a second dielectric filled channel 1714 may extend through the entire p-type layer 1706, but only through a portion of the height of the n-type layer 1704. This may allow electrically conductivity in the y direction.

A first conductive line 1722 formed on a printed circuit board (PCB) substrate 1720 may be attached to a conductive pad 1708 formed, providing an electrical connection to the first pixel 1707a and the second pixel 1707b. The first conductive line 1722 may be an n-type contact. As described in more detail below, the conductive pad 1708 may be formed on an insulated conductive via 1724 that may carry the electrical connection to the n-type layer 1704. Because the second dielectric filled channel 1714 does not extend through the entire thickness of the n-type layer 1704, the electrical connection from the first conductive line 1722 may extend through the n-type layer 1704 in the x direction. A second conductive line 1725 formed on the PCB substrate 1720 may be attached to a conductive pad 1708 formed on the p-type layer 1706. Because the second dielectric filled channel 1714 extends through the entire thickness of the p-type layer 1704, a second conductive line 1725 may be placed on either side of the second dielectric filled channel 1714. The second dielectric filled channel 1714 may define multiple emitters associated with each second conductive line 1725.

The LED segments may be sized to laterally extend between 25 and 1000 microns, or more typically, between 50 and 500 microns. The first dielectric filled channel 1712 and the second dielectric filled channel 1714 separating the segments may be filled with an optically and electrically isolating dielectric material. The LED segments may have a square, rectangular, polygonal, circular, arcuate or other surface shape. The first dielectric filled channel 1712 and the second dielectric filled channel 1714 may be of uniform width and length, or may vary as needed. Pixel arrays of the LED segments can be arranged in geometrically straight rows and columns, staggered rows or columns, curving lines, or semi-random or random layouts. Single or multiple lines of LED segments are also supported. Radial or other non-rectangular grid arrangements of conductive lines to the LED segments may be used. Curving, winding, serpentine, and/or other suitable non-linear arrangements of conductive lines to the LED segments may be used.

Referring to FIGS. 1P-1X cross section views illustrating process steps for forming the segmented LED emitter 1700 are shown. FIGS. 1P-1X illustrate the segmented LED interconnect system from the x direction. As seen with respect to FIG. 1P, a substrate 1802, typically formed of sapphire or silicon carbide, may support an epitaxially grown or deposited semiconductor n-type layer 1804. A semiconductor p-type layer 1806 is sequentially grown or deposited on the n-type layer 1804, forming an active region 1805 at the junction between layers. The n-type layer 1804, the active region 1805, and the p-type layer 1806 may be collectively referred to as an epitaxial layer 1809. Semiconductor materials capable of forming high-brightness light emitting devices can include, but are not limited to, Group III-V semiconductors, particularly binary, ternary, and quaternary alloys of gallium, aluminum, indium, and nitrogen, also referred to as III-nitride materials. Such semiconductor materials can be grown to support both LED and laser systems as necessary.

Figure 1Q:
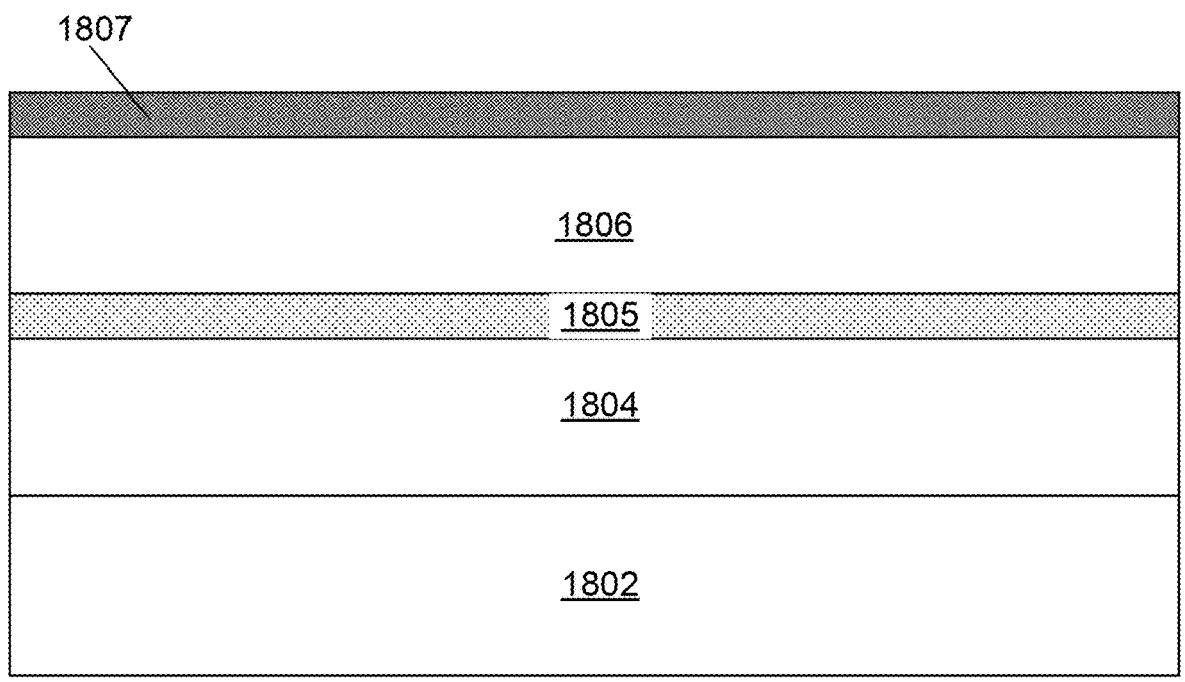
FIG. 1Q shows forming a patterning layer on the epitaxial layer.

As seen in FIG. 1Q, a conductive layer 1807 may be formed on the p-type layer 1706. The conductive layer 1807 may be may be composed of an electrically conductive material, such as a metal. The conductive layer 1807 may be formed of any material that reflects visible light, such as, for example, a refractive metal. The conductive layer 1807 may be composed of one or more of a metal such as silver, gold, copper, a metal stack, or combinations thereof. The conductive layer 1807 may be formed by any method suitable for metal deposition, such as plating, atomic layer deposition (ALD), evaporation, reactive sputtering, chemical solution deposition, spin-on deposition, or other like processes.

Figure 1R:
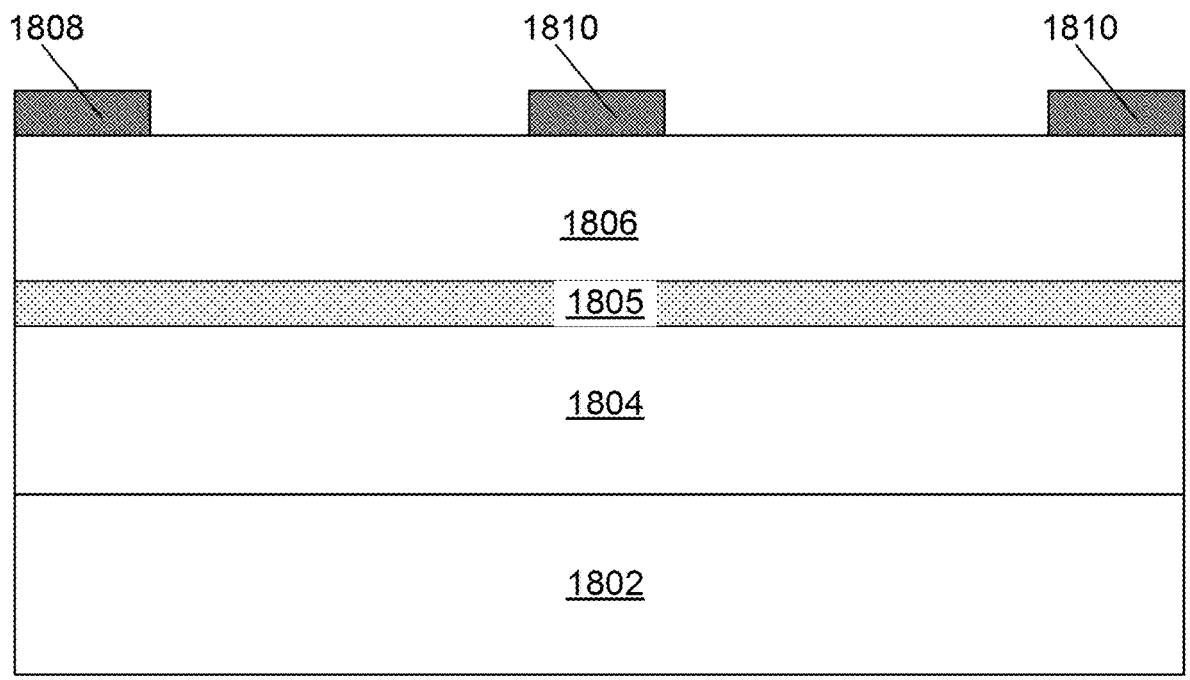
FIG. 1R shows exposing surfaces of the epitaxial layer.

As seen in FIG. 1R, metal contacts, including an n-type contact 1808 and a p-type contact 1810, may be formed from the conductive layer 1807 using selective masking and etching, or alternatively, direct patterned etching.

Figure 1S:
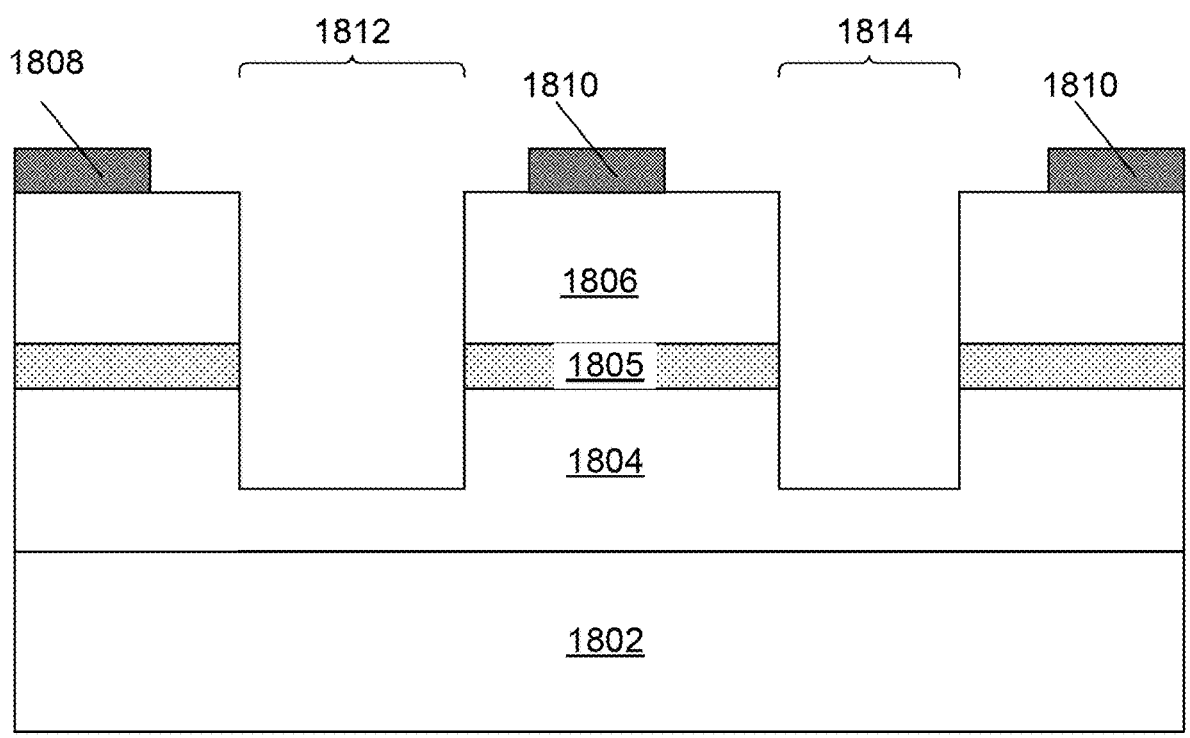
FIG. 1S shows forming trenches in the epitaxial layer.

As seen in FIG. 1S, a second round of selective masking and etching, or alternatively, direct patterned etching, may be used to define a first channels 1812 and a second channel 1814. The first channel 1812 and the second channel 1814 may extend through an entire thickness of the p-type layer 1806 and a portion of the n-type layer 1804.

Figure 1T:
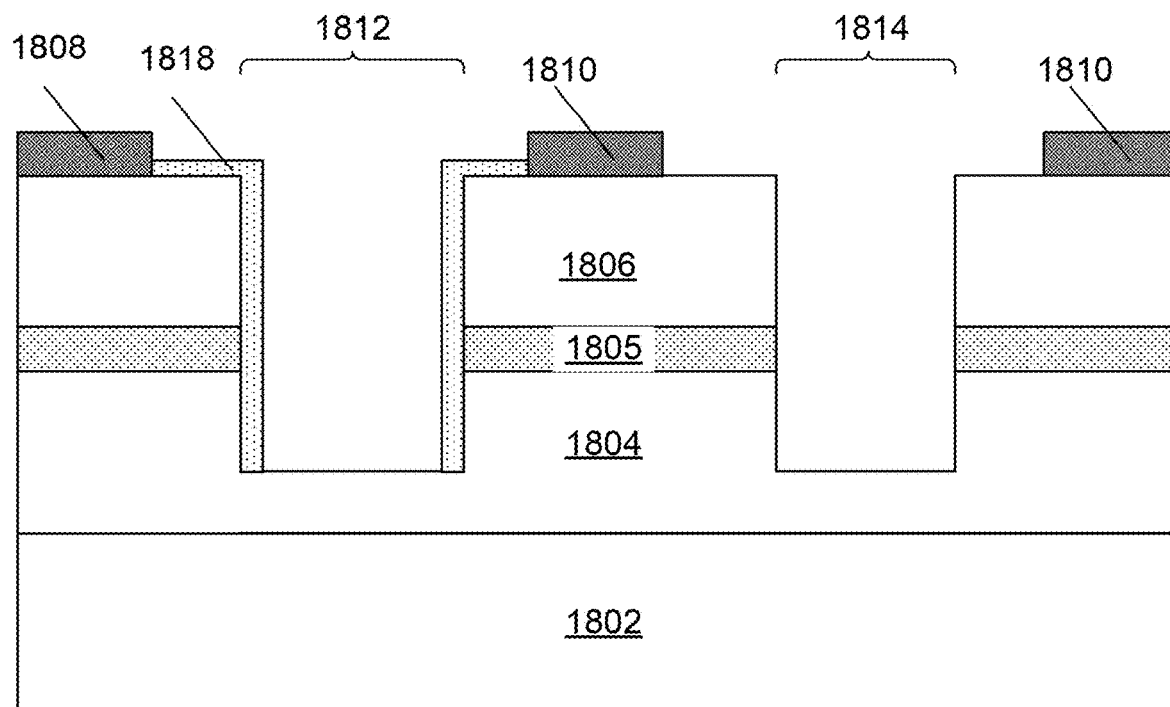
FIG. 1T shows forming an insulating lining in a trench.

As seen in FIG. 1T, sidewalls of the first channel 1812 may be coated with an insulating lining 1818, such as, silicon dioxide or another dielectric material. The insulating lining 1818 may extend to an upper surface of the p-type layer 1706. The electrical insulator may be formed such that a portion of the n-type layer 1804 at the bottom of the first channel 1812 remains exposed. This may be done using a directional etching process.

Figure 1U:
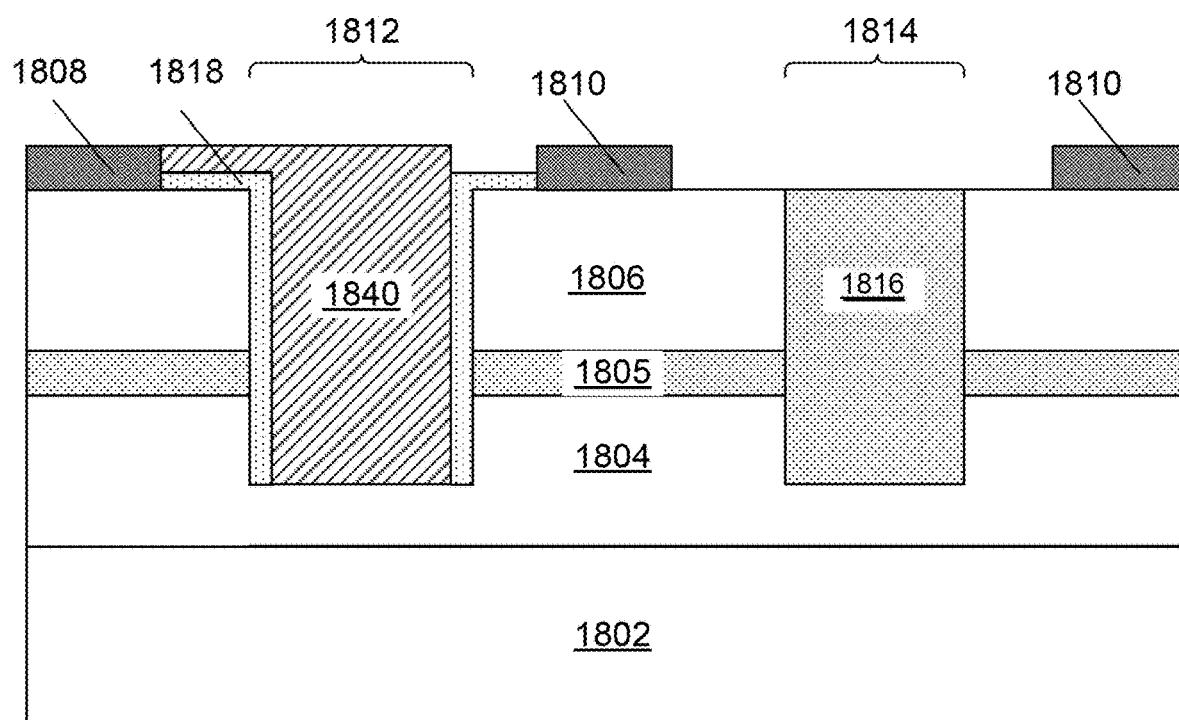
FIG. 1U shows forming a conductive via on the insulating lining and an isolation region.

As seen in FIG. 1U, a conductive via 1840 may be formed in the first channel 1812. An isolation region 1816 may be formed in the second channel 1814. The conductive via 1840 may provide contact between the exposed n-type layer 1804 and the n-type contact 1808. The conductive via 1840 may be may compose an electrically conductive material, such as a metal. The conductive via 1840 may be composed of one or more of a metal such as silver, gold, copper, a metal stack, or combinations thereof. The conductive via 1840 may be formed by any method suitable for metal deposition, such as plating, ALD, evaporation, reactive sputtering, chemical solution deposition, spin-on deposition, or other like processes.

The insulator 1816 may be an optically and/electrically isolating dielectric material, that may include organic, inorganic, or organic/inorganic binder and filler material. For example, acrylate or nitrocellulose may be used in conjunction with ceramic particles. Another organic/inorganic binder and filler may be, for example, epoxy with embedded reflective titanium oxide or other reflective/scattering particles. Inorganic binders may include sol-gel (e.g., a sol-gel of TEOS or MTMS) or liquid glass (e.g., sodium silicate or potassium silicate), also known as water glass. Binders may include fillers that adjust physical properties. Fillers may include inorganic nanoparticles, silica, glass particles or fibers, or other materials able to improve optical or thermal performance.

Although not shown in FIG. 1T, sidewalls and a bottom of the second channel 1814 may be coated with light absorbers, reflectors (including a stack of dielectric layers that form a distributed Bragg reflector), other optical coating, or electrically insulating material prior to the deposition of the insulator 1816. The insulator 1816 may be formed using a conventional deposition technique, such as, for example, chemical vapor deposition (CVD), plasma enhanced chemical vapor deposition (PECVD), metal-organic chemical vapor deposition (MOCVD), ALD, evaporation, reactive sputtering, chemical solution deposition, spin-on deposition, or other like processes.

Figure 1V:
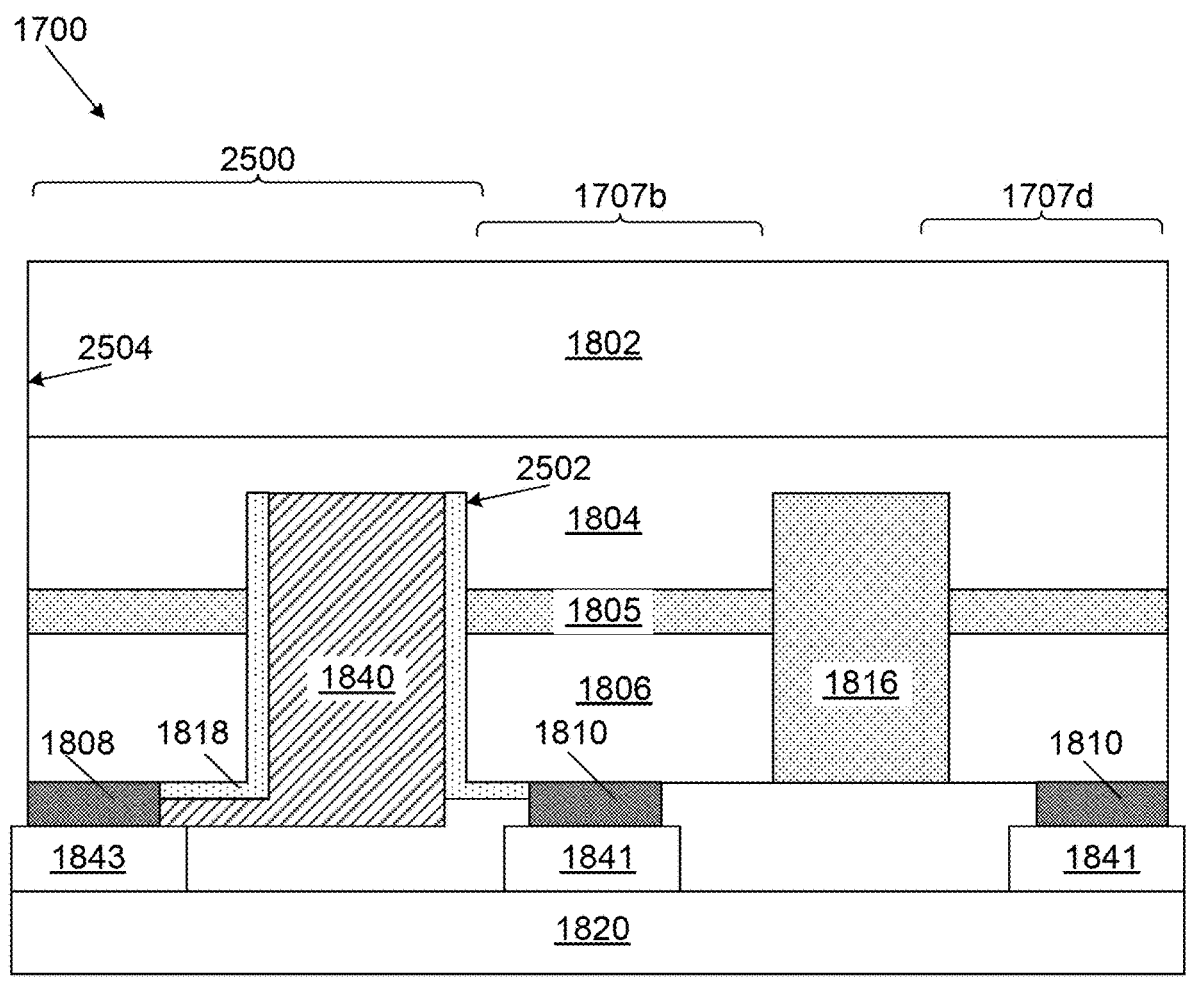
FIG. 1V shows mounting the epitaxial layer to a base.

As seen in FIG. 1V, the structure may be inverted and attached (e.g., after heating and reflow) using the n-type contact 1808 and p-type contacts 1810 to a printed circuit board (PCB) substrate 1820. The PCB substrate 1820 may support an n-type conductive line 1843 and one or more p-type conductive lines 1841 that extend between each segmented LED 1700 and suitable electric power and drive circuitry (not shown) that may be positionable on the PCB substrate 1820.

Portions of the LED array 1700 that are not occupied by pixels may be referred to as a non-emission portion 2500 or "dead space." The dimensions of the pixels 1707 and the dimensions of the non-emission portion 2500 may vary in the embodiments described herein. In an example, the non-emission portion may be a portion of the LED array 1700 between an inner edge 2502 of the conductive via 1840 and an outer edge 2502 of the LED array 1700. In another example, as shown in FIG. 1Y, the non-emission portion 2500 may be a portion of the LED array 1700 between an outer edge 2506 of the isolation region 1816 and the outer edge 2052 of the LED array 1700. The pixels 1700 may have a width of approximately 1 µm to several millimeters. The non-emission portion 2500 may have a width compared to the pixels 1707, such that it occupies approximately 1% to approximately 20% of the total width of the LED array 1700.

As described above, the insulating material may not extend through the entire thickness of the n-type layer 1804, which may provide conductivity in the n-type layer 1804 between the second pixel 1707b and the fourth pixel 1707d. Current may flow through the n-type conductive line 1843, to the n-type contact 1808, to the conductive via 1840, to the n-type layer 1804. The current may be insulated from the p-type layer 1806 by the insulating lining 1818. The flow of current through the n-type layer and the segmentation of the p-type layer by the insulator 1816 may provide for different emitting sections (i.e., the second pixel 1707b and the fourth pixel 1707d).

It should be noted that the segmented LED emitter 1700 may be formed with any number of pixels. For example, the segmented LED emitter 1700 may only have one p-type contact 1810, resulting in only one pixel 1707. Examples of a single emitter segmented LED 1700 are described herein. The p-type contact 1810 may be between the insulator 1816 and the conductive via 1840 to form the first pixel 1707a. In FIG. 1Y, the insulator 1816 may be located between the p-type contact 1810 and the conductive via 1840 to form a single pixel 1707. In FIG. 1Z, the insulator 1816 may not be formed, resulting in a larger pixel 1707.

Figure 1W:
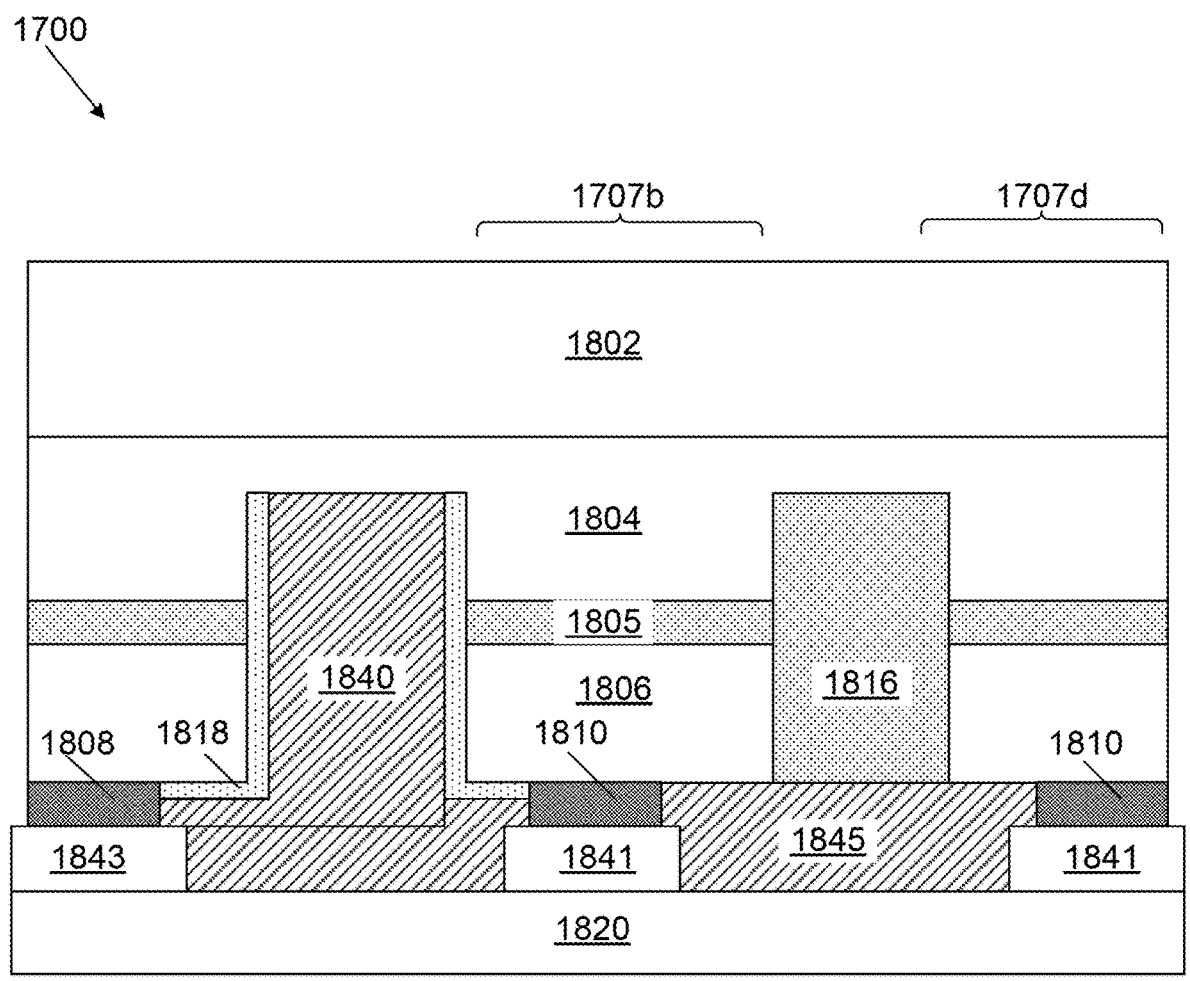
FIG. 1W shows an optional underfill layer.
Figure 1X:
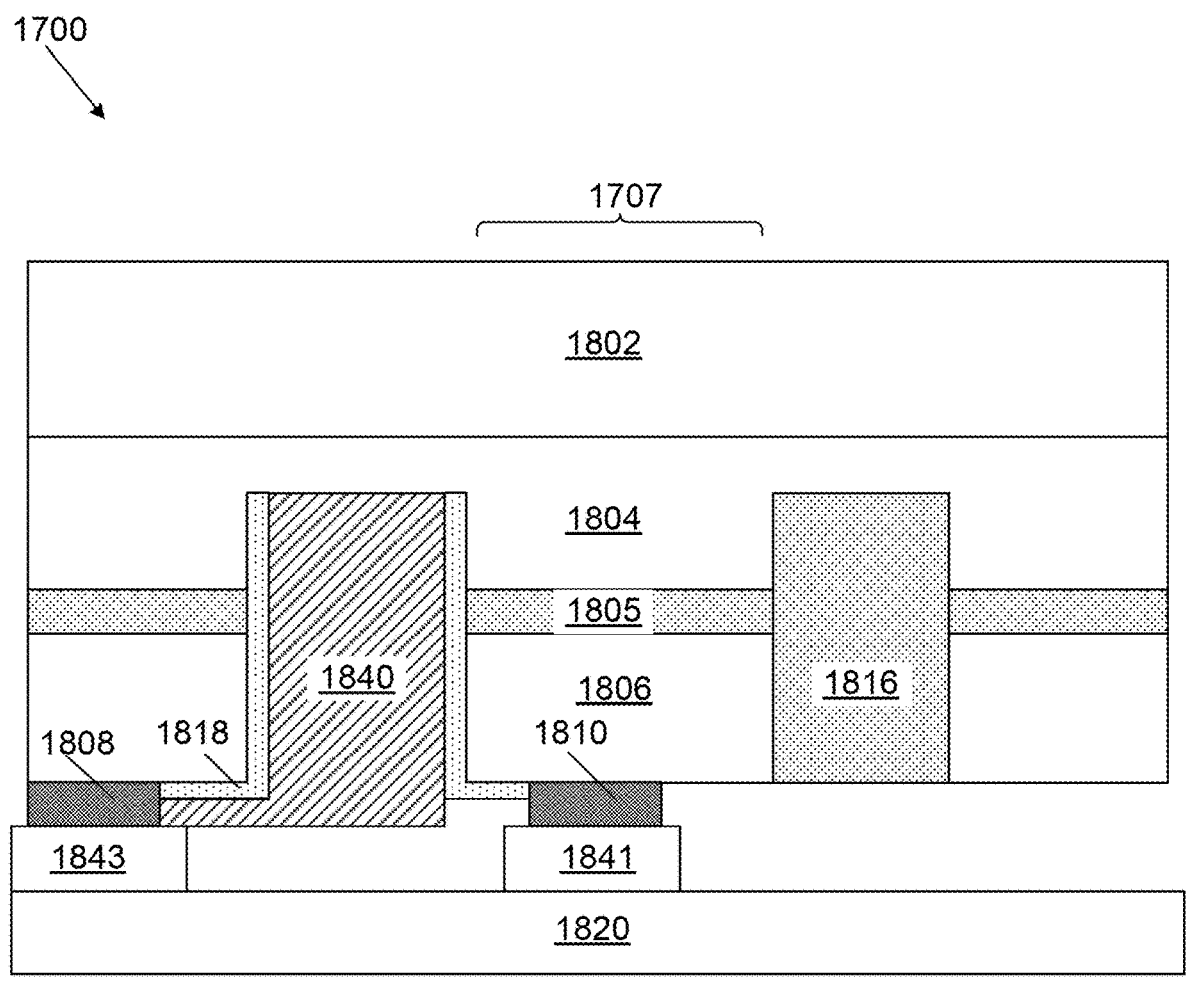
FIG. 1X shows an LED.
Figure 1Y:
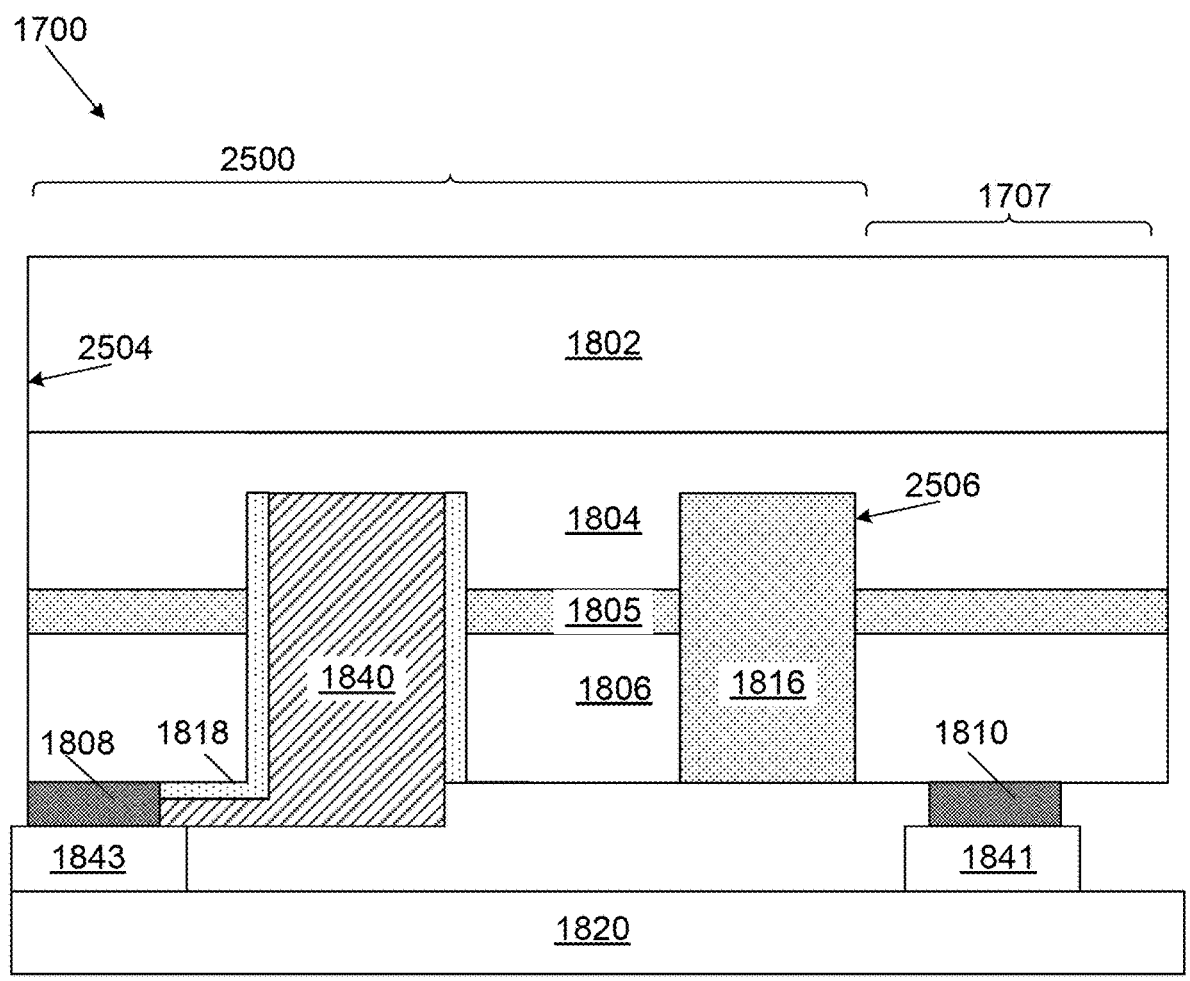
FIG. 1Y shows another LED.
Figure 1Z:
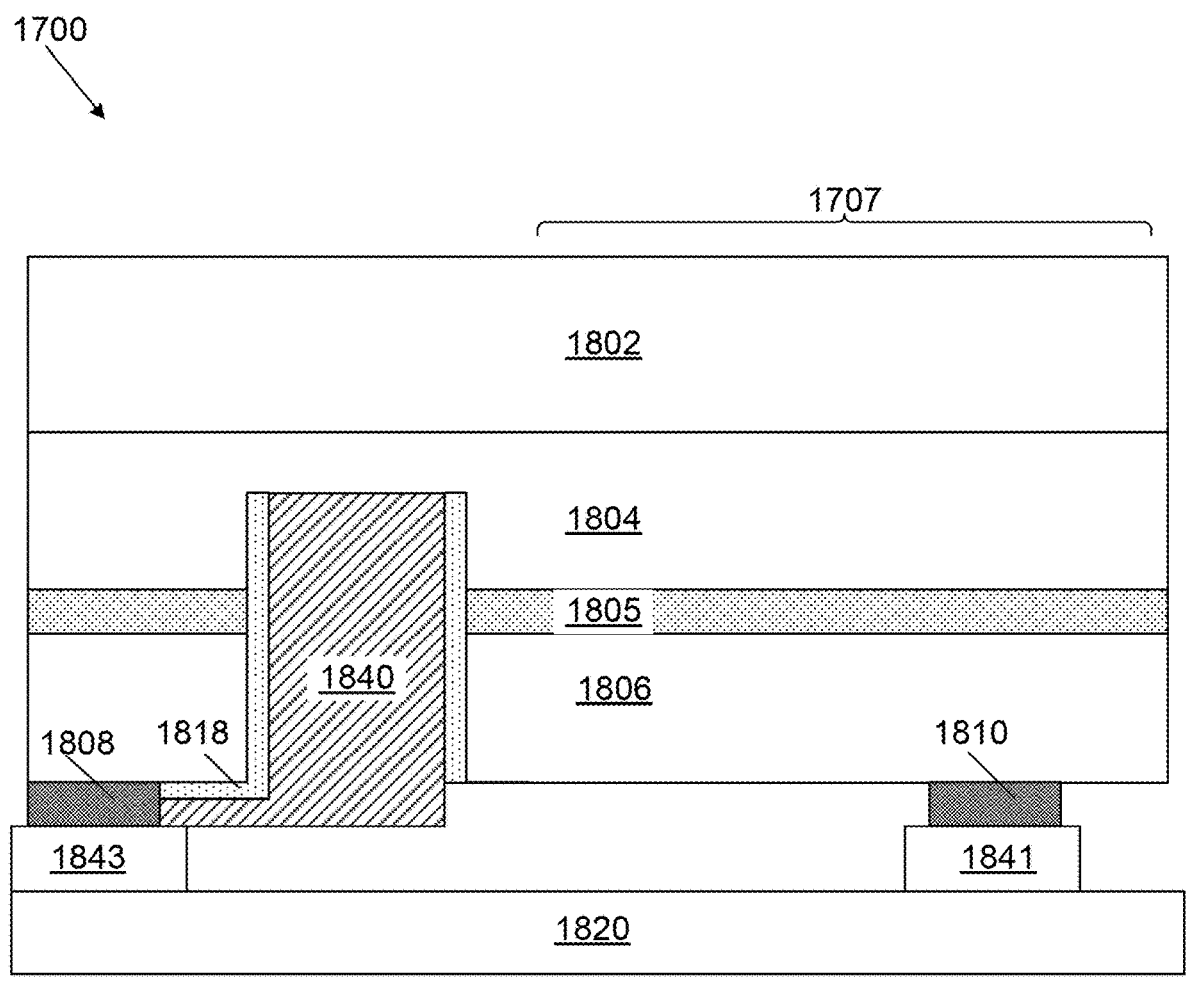
FIG. 1Z shows another LED.
Figure 1A:
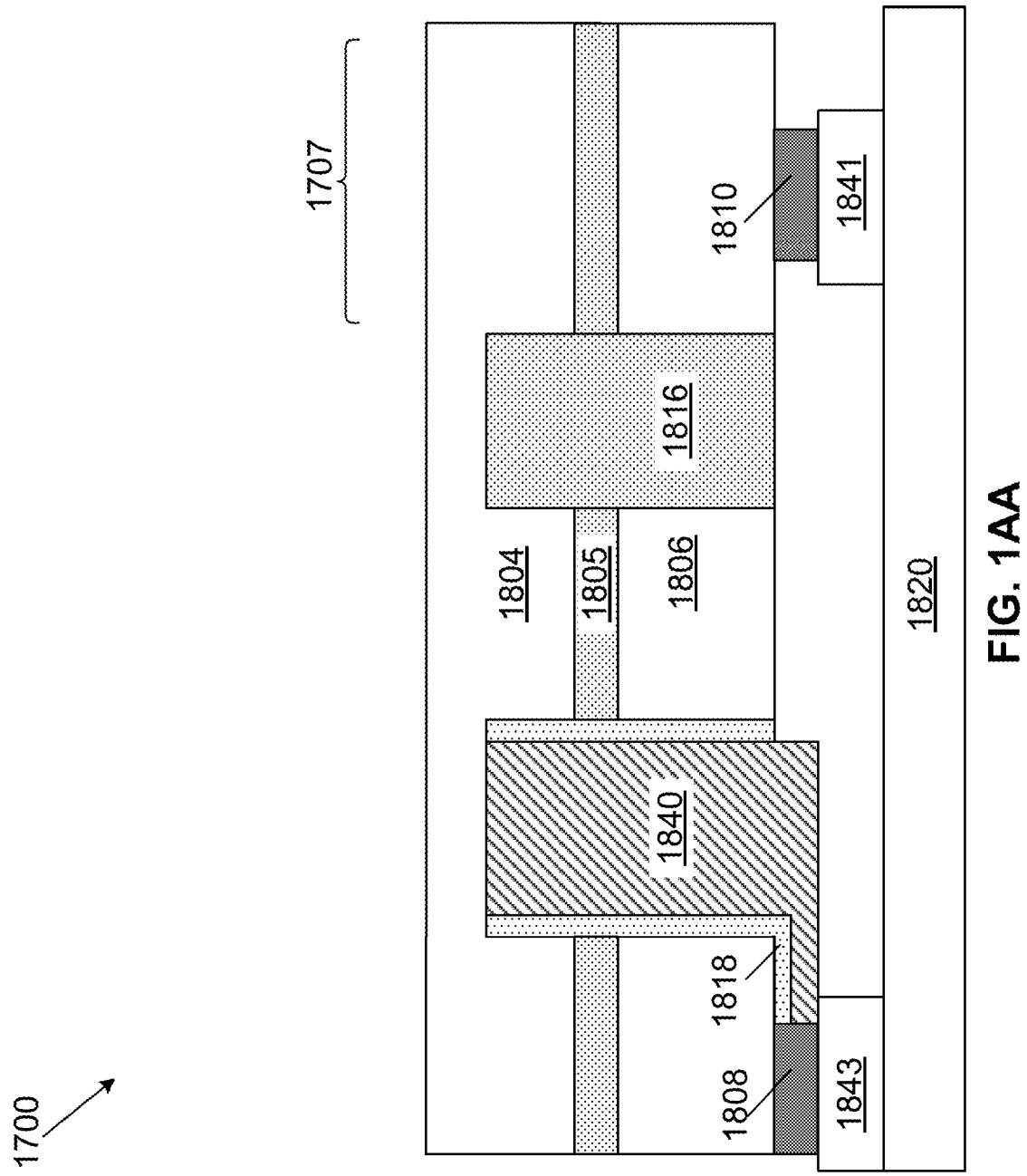
Figure 1A:
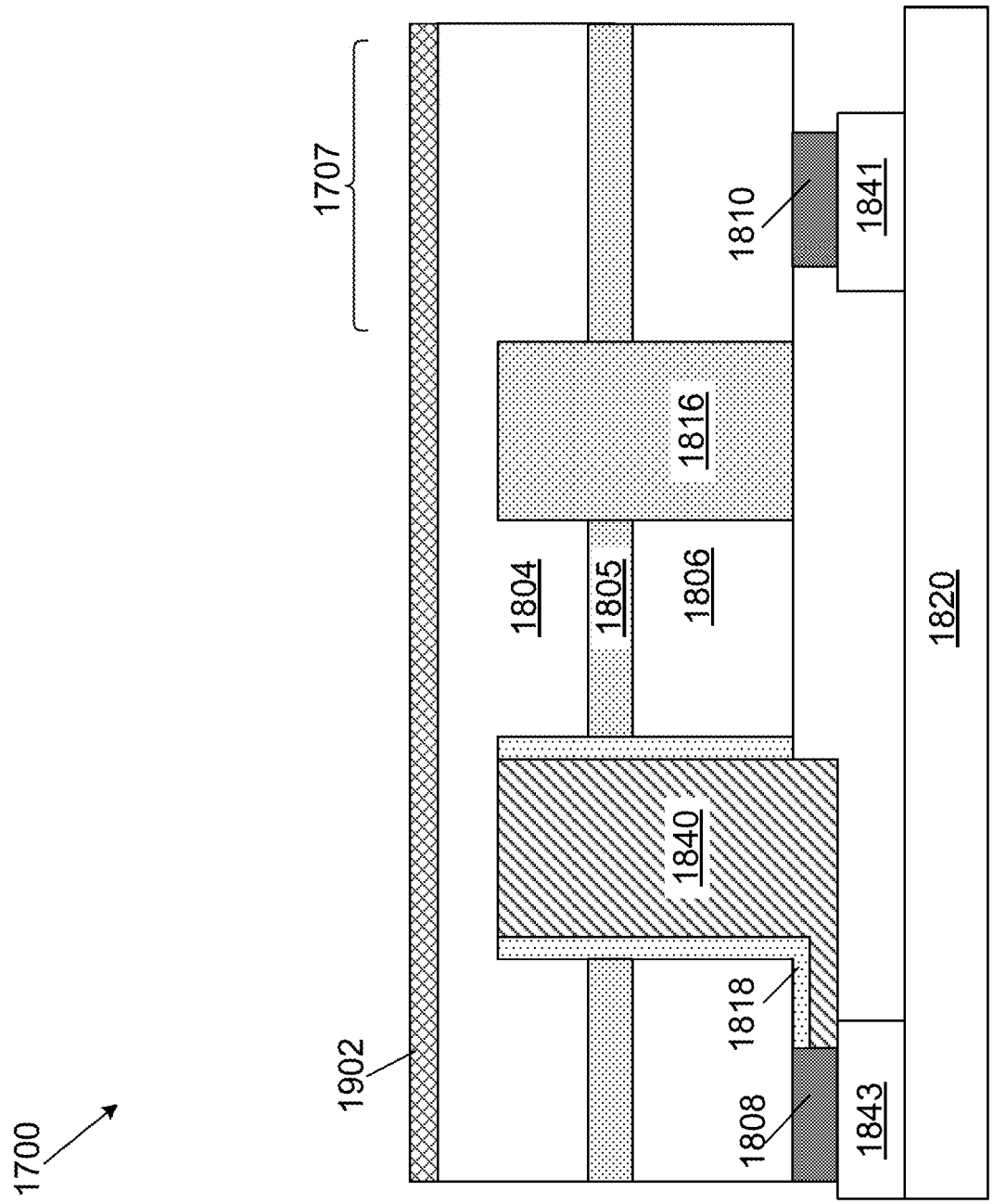
Figure 1A:
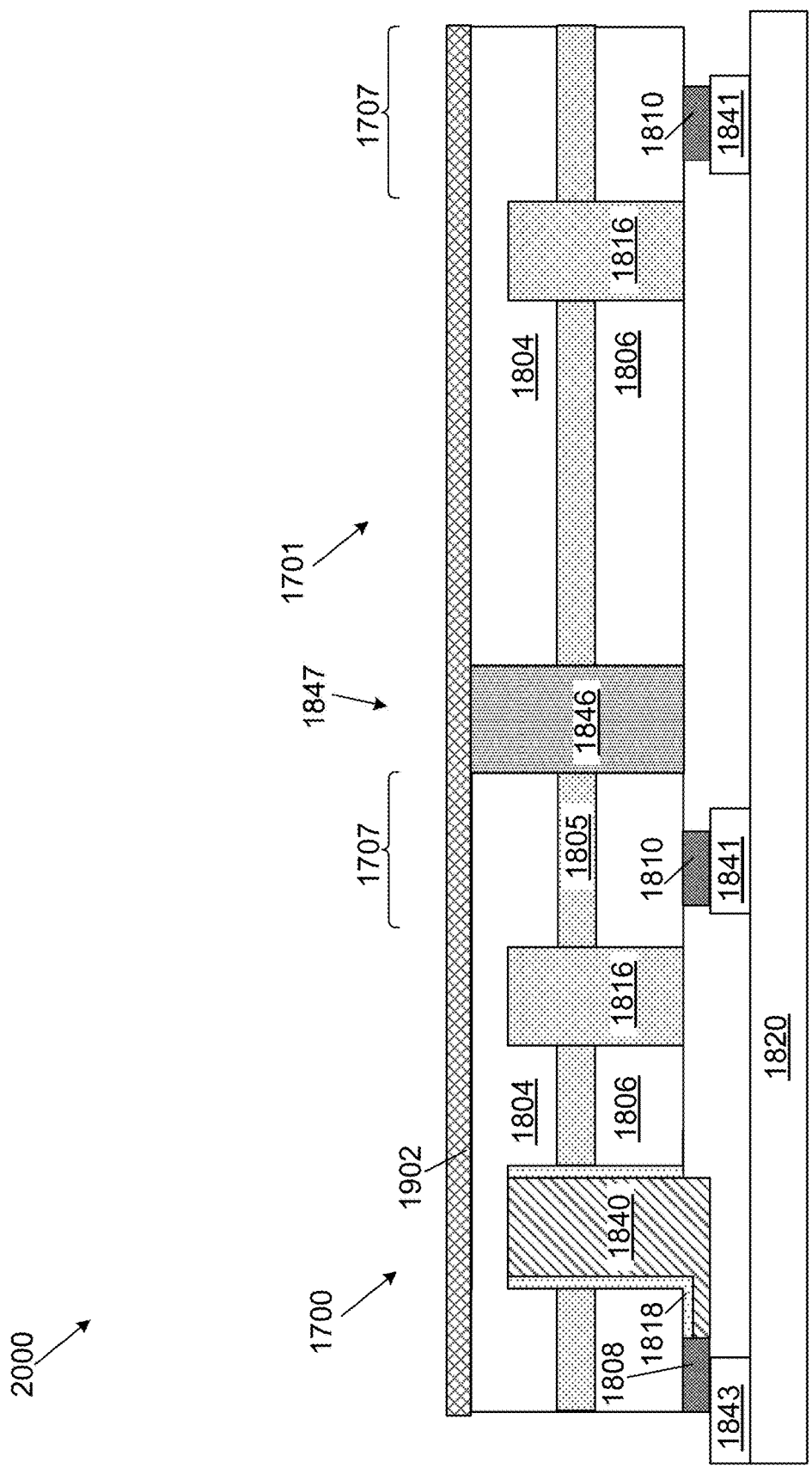
Figure 1A:
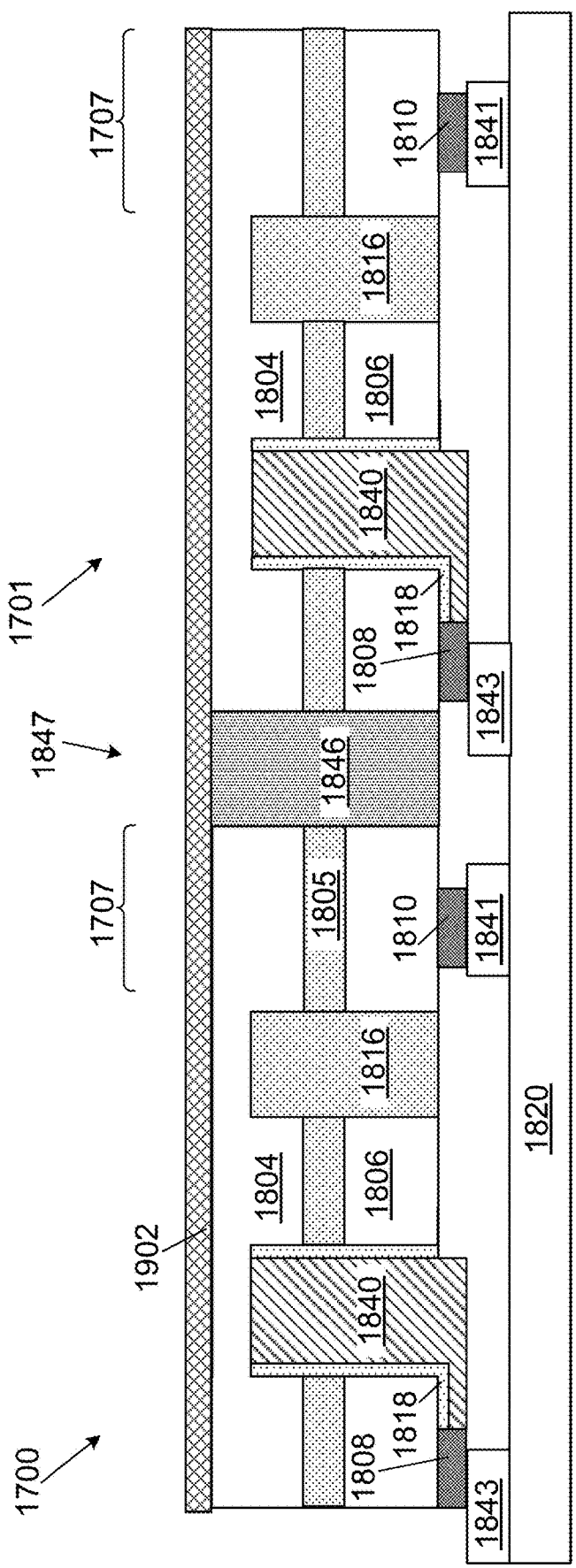
Figure 1A:
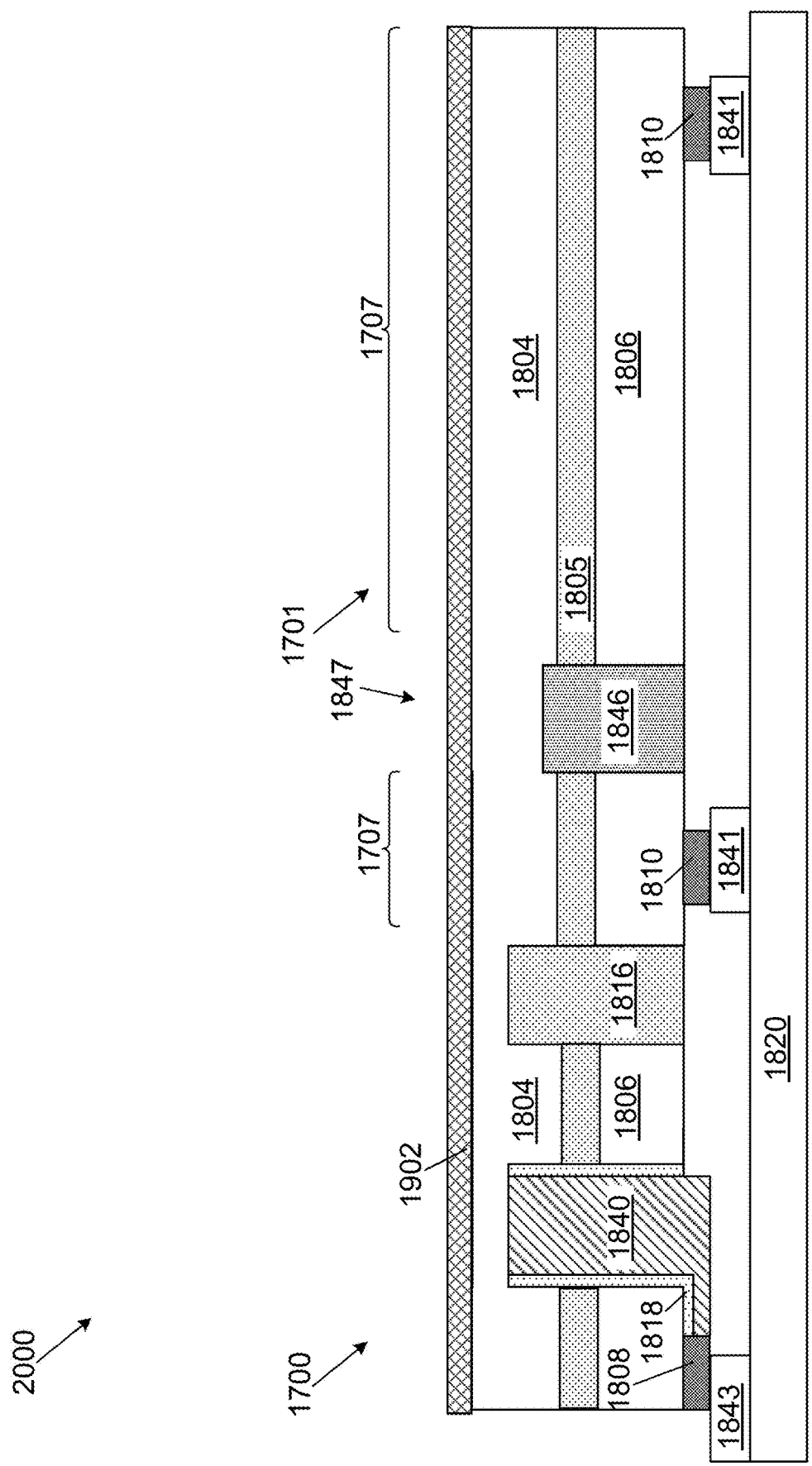
Figure 1A:
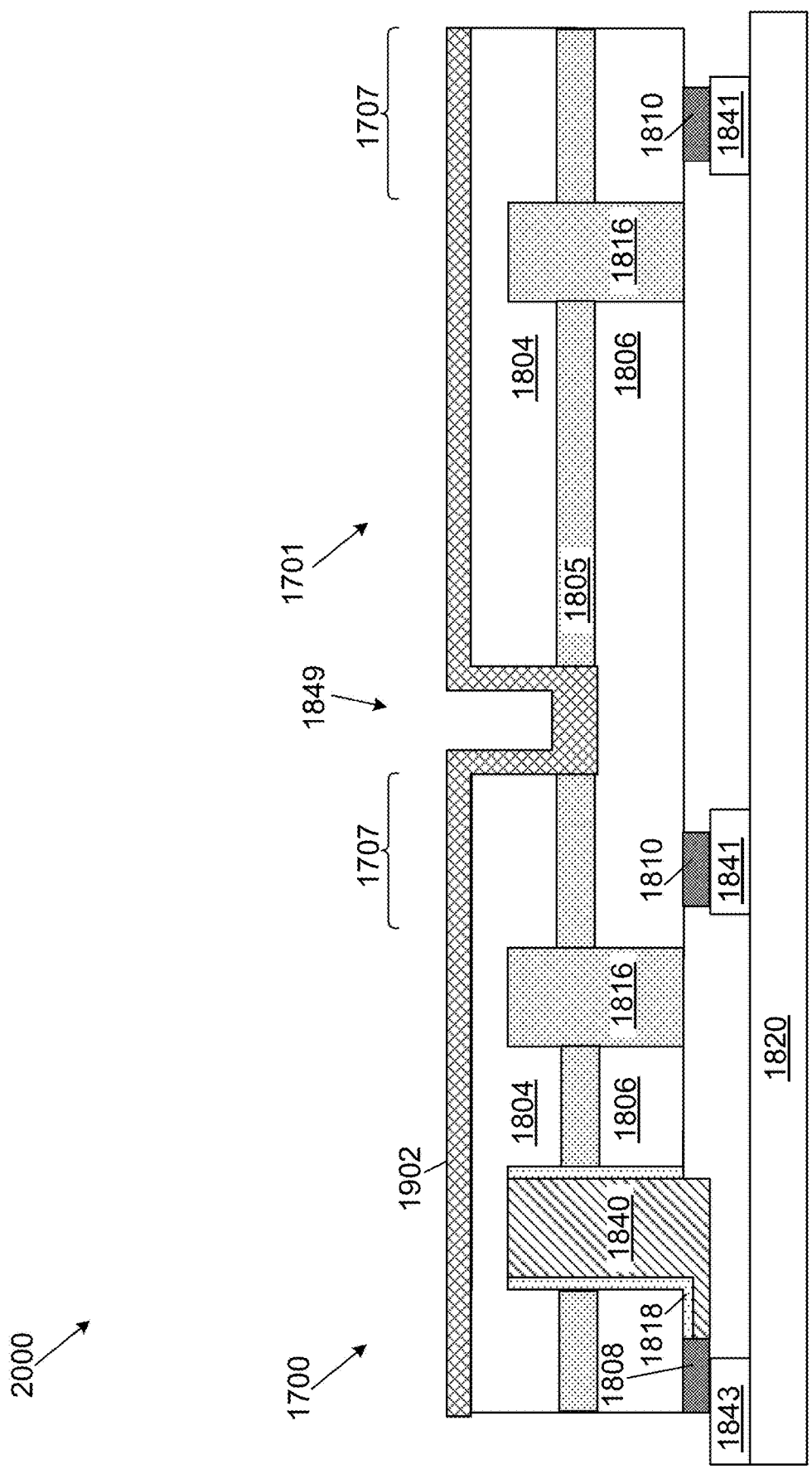
Figure 1A:
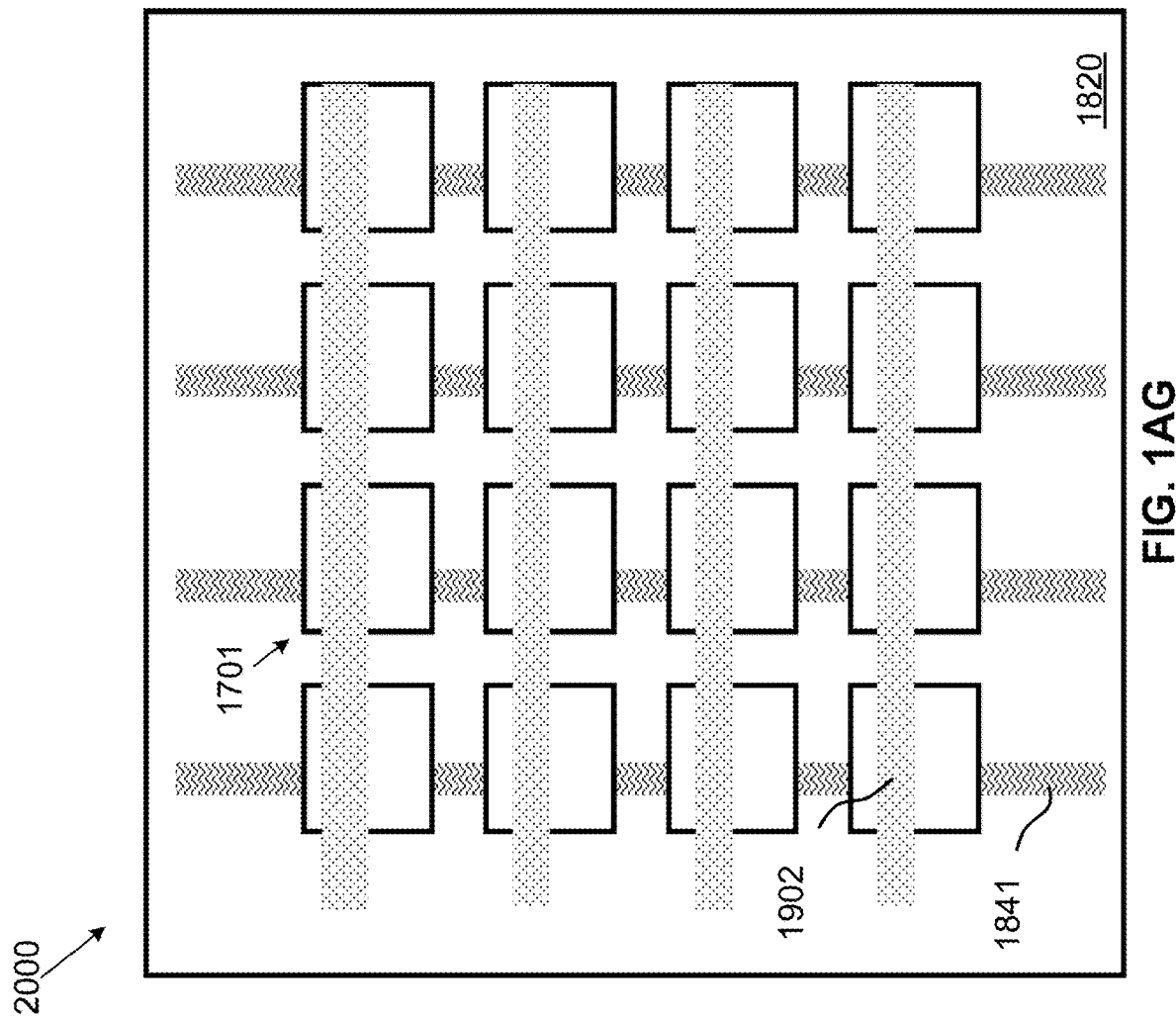
Figure 1A:
Figure 1A:
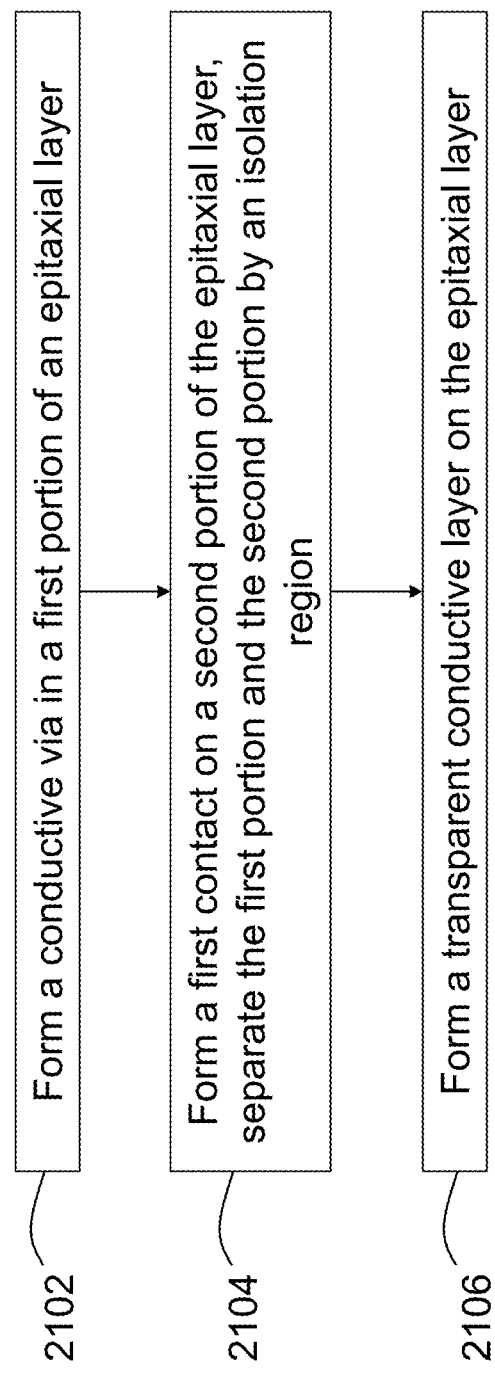

FIG. 1W shows an optional underfill layer 1845 between the epitaxial layer 1809 and the PCB 1820. The underfill layer 1845 may compose a conventional electrically and/or thermally insulating material, such as a dielectric. The underfill layer 1845 may be directly deposited on the PCB 1820 or it may be formed using a flow process.

Alternatively, the segmented LED emitter 1700 may have multiple sections of the insulator 1816 and multiple n-type contacts 1810 extending in the x direction, resulting in any configurable number of pixels.

As seen in FIG. 1AA, the substrate 1802 may be removed from segmented LED emitter 1700 shown in FIG. 1Y. A laser liftoff or other epitaxial film separation may be used to remove the substrate 1802. Polishing or photo electrochemical etching may be applied to modify surface and optical properties of the n-type layer 1704.

As seen in FIG. 1AB, a transparent conductive layer 1902 may be formed on at least an upper surface of LED 1700 The transparent conductive layer 1902 may be composed of a transparent conductor such as antimony tin oxide (ATO), indium tin oxide (ITO), silver nanowires, or doped conductive graphene. The transparent conductive layer 1902 may be deposited in separate, distinct lines, strings, pads, or blocks. Complex curved, circular, or winding layouts are possible.

The transparent conductive layer 1902 may carry current from the n-type conductive line 1843, to the n-type contact 1808, to the conductive via 1840, to the n-type layer 1804. The conductive line 1841 may carry current to the p-type contact 1810 and into the p-type layer 1806. Each of the currents may meet at a junction of the n-type layer 1804 and the p-type layer 1806 to excite the active region 1805 such that light is emitted from a pixel 1707.

Referring now to FIG. 1AC, an example of an LED array 2000 is shown. The LED array 2000 may include a first LED 1700 adjacent to a second LED 1701. The n-type layer 1804 of the first LED 1700 may be electrically coupled to the n-type layer 1804 of the second LED 1701.

As shown in FIG. 1AC, it may not be necessary for the second LED 1701 to include the n-type via 1840, the n-type contact 1808, and the insulating lining 1818. In addition, an additional n-type conductive line 1843 for the second LED 1701 may not be needed. However, as shown in FIG. 1AD, these optional features may be included in the second LED 1701.

As shown in FIGS. 1AC and 1AD, the first LED 1700 may be separated from the second LED 1701 by a separation region 1846. The separation region 1846 may be formed using conventional patterning, etching, and deposition techniques. For example, portions of the n-type layer 1804 and the p-type layer 1806 may be removed using an etching process to form a trench. The separation region 1846 may be formed in the trench using a conventional deposition process. The separation region 1846 may compose an insulating material, such as a dielectric.

FIG. 1AE shows another example of the LED array 2000 in which the second LED 1701 is formed without the insulator 1816 present in the first LED 1700. This may result in a pixel 1707 having a larger width. In addition, FIG. 1AE shows that the separation region 1846 may be formed only through a portion of the n-type layer 1804.

FIG. 1AF shows another example of the LED array 2000 in which a trench 1849 is formed in the n-type layer 1804 to separate the first LED 1700 and the second LED 1701. The trench 1849 may be formed using a conventional etching process. The transparent conductive layer 1902 may be conformal and may be formed in the trench 1849.

It should be noted that any combination of the first LED 1700 and the second LED 1701 may be used to form the LED array, and any combination of a separation region 1847 and trench 1849 may be used to define the first LED 1700 and the second LED 1701.

FIG. 1AG illustrates an overhead view of one or more LED arrays 2000 using the transparent conductive layer 1902 on top and the p-type conductive lines 1841 on the bottom of individual LED 1700. The p-type conductive lines 1841 may be laid out as columns, with each LED 1700 connected. The conductive lines 1902 may be laid out to extend over rows of LEDs 1700, with a connection to the PCB 1820 made through the n-type layer 1804, the conductive via 1840, the n-type contact 1808, and the n-type conductive line 1843. In another example, the conductive lines 1902 may be electrically connected to PCB 1820 via wire bonds (not shown) or other suitable electrical contact or trace. Together, the conductive lines 1902 and the p-type conductive lines 1841 form a crossbar allowing activation (addressing) of selected pixels, lines of pixels, or blocks of pixels.

Referring now to FIG. 1AH, a cross section view illustrating another example of the LED 1700. In this example, the conductive via 1840 may be formed using the processes described below, but may be located on the outer edge 2504 of the LED array 1700. An optional dielectric coating may be formed on the outer surface 2508 of the conductive via. This arrangement may be used in any of the embodiments described herein.

Referring now to FIG. 1AI, a flowchart illustrating a method of forming a device is shown. In step 2102, a conductive via may be formed in a first portion of an epitaxial layer. In step 2104, a first contact may be formed on a second portion of the epitaxial layer. The first portion and the second portion may be separated by an isolation region. In step 2106, a transparent conductive layer may be formed on the epitaxial layer.

As will be appreciated, various additions other modifications to the above-described LED architecture and process are possible. Pixels may be overlain with wavelength converting materials such as phosphors, quantum dots, or dyes. Multiple types and thicknesses of phosphors may be used. An LED combined with one or more wavelength converting materials may be used to create white light or monochromatic light of other colors. All or only a portion of the light emitted by the pixel may be converted by the wavelength converting material. Unconverted light may be part of the final spectrum of light, though it need not be. Examples of common devices include a blue-emitting pixel combined with a yellow-emitting phosphor, a blue-emitting pixel combined with green- and red-emitting phosphors, a UV-emitting pixel combined with blue- and yellow-emitting phosphors, and a UV-emitting pixel combined with blue-, green-, and red-emitting phosphors. The phosphors may be electrophoretically deposited on an pixel with application of a voltage to a particular transparent conductor string. Varying applied voltage duration will correspondingly vary amount and thickness of deposited phosphors. Alternatively, the pixel may be coated with the phosphor, using an organic binder to adhere the phosphor particles to the LED. Phosphors may be dispensed, screen printed, sprayed, molded, or laminated. Alternatively, for certain applications, a phosphor contained in glass, or a pre-formed sintered ceramic phosphor may be attached to the LED.

Microlenses or other primary or secondary optical elements (including reflectors, scattering elements, or absorbers) may be attached to each pixel or associated phosphor. A primary optic may be positioned over the entire array of pixels, and directly attached or mounted at a distance from the pixels in suitable packaging. Protective layers, transparent layers, thermal layers, or other packaging structures may be used as needed for specific applications.

Figure 2A:
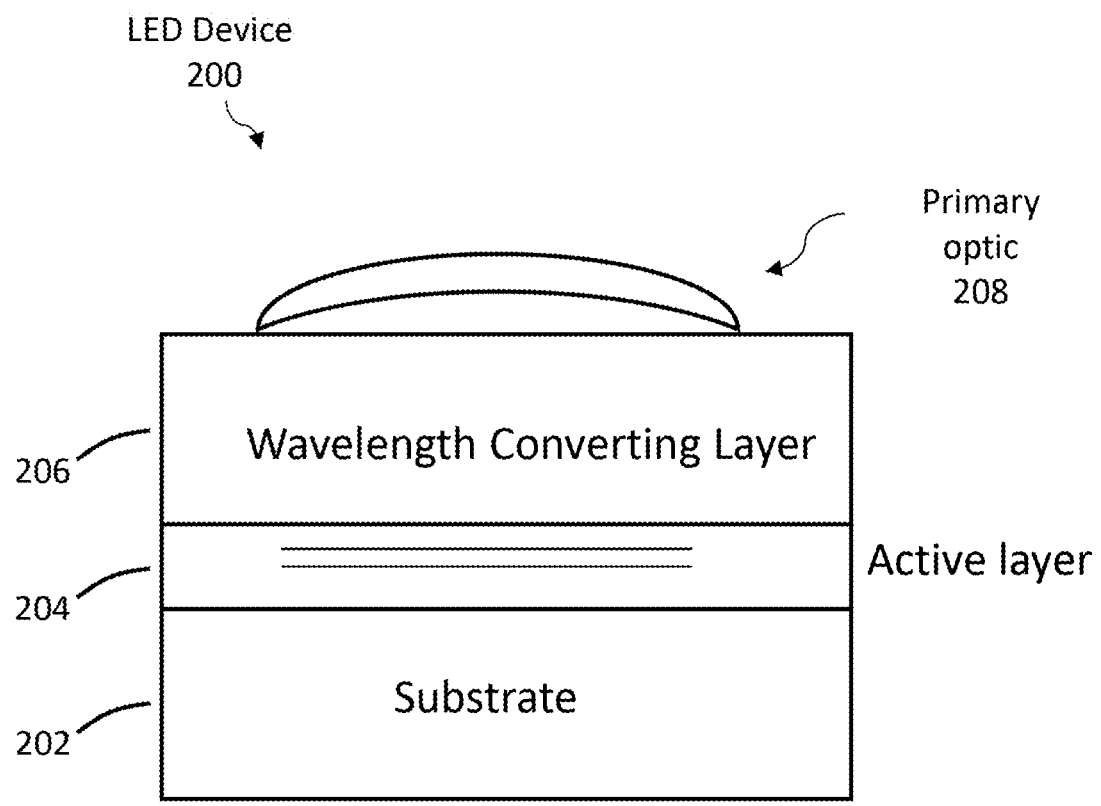
FIG. 2A is a diagram showing an Light Emitting Diode (LED) device.

FIG. 2A is a diagram of an LED device 200 in an example embodiment. The LED device 200 may include a substrate 202, an active layer 204, a wavelength converting layer 206, and primary optic 208. In other embodiments, an LED device may not include a wavelength converter layer and/or primary optics.

As shown in FIG. 2A, the active layer 204 may be adjacent to the substrate 202 and emits light when excited.

Suitable materials used to form the substrate 202 and the active layer 204 include sapphire, SiC, GaN, Silicone and may more specifically be formed from a III-V semiconductors including, but not limited to, AlN, AlP, AlAs, AlSb, GaN, GaP, GaAs, GaSb, InN, InP, InAs, InSb, II-VI semiconductors including, but not limited to, ZnS, ZnSe, CdSe, CdTe, group IV semiconductors including, but not limited to Ge, Si, SiC, and mixtures or alloys thereof.

The wavelength converting layer 206 may be remote from, proximal to, or directly above active layer 204. The active layer 204 emits light into the wavelength converting layer 206. The wavelength converting layer 206 acts to further modify wavelength of the emitted light by the active layer 204. LED devices that include a wavelength converting layer are often referred to as phosphor converted LEDs ("POLED"). The wavelength converting layer 206 may include any luminescent material, such as, for example, phosphor particles in a transparent or translucent binder or matrix, or a ceramic phosphor element, which absorbs light of one wavelength and emits light of a different wavelength.

The primary optic 208 may be on or over one or more layers of the LED device 200 and allow light to pass from the active layer 204 and/or the wavelength converting layer 206 through the primary optic 208. The primary optic 208 may be a lens or encapsulate configured to protect the one or more layers and to, at least in part, shape the output of the LED device 200. Primary optic 208 may include transparent and/or semi-transparent material. In example embodiments, light via the primary optic may be emitted based on a Lambertian distribution pattern. It will be understood that one or more properties of the primary optic 208 may be modified to produce a light distribution pattern that is different than the Lambertian distribution pattern.

Figure 2B:
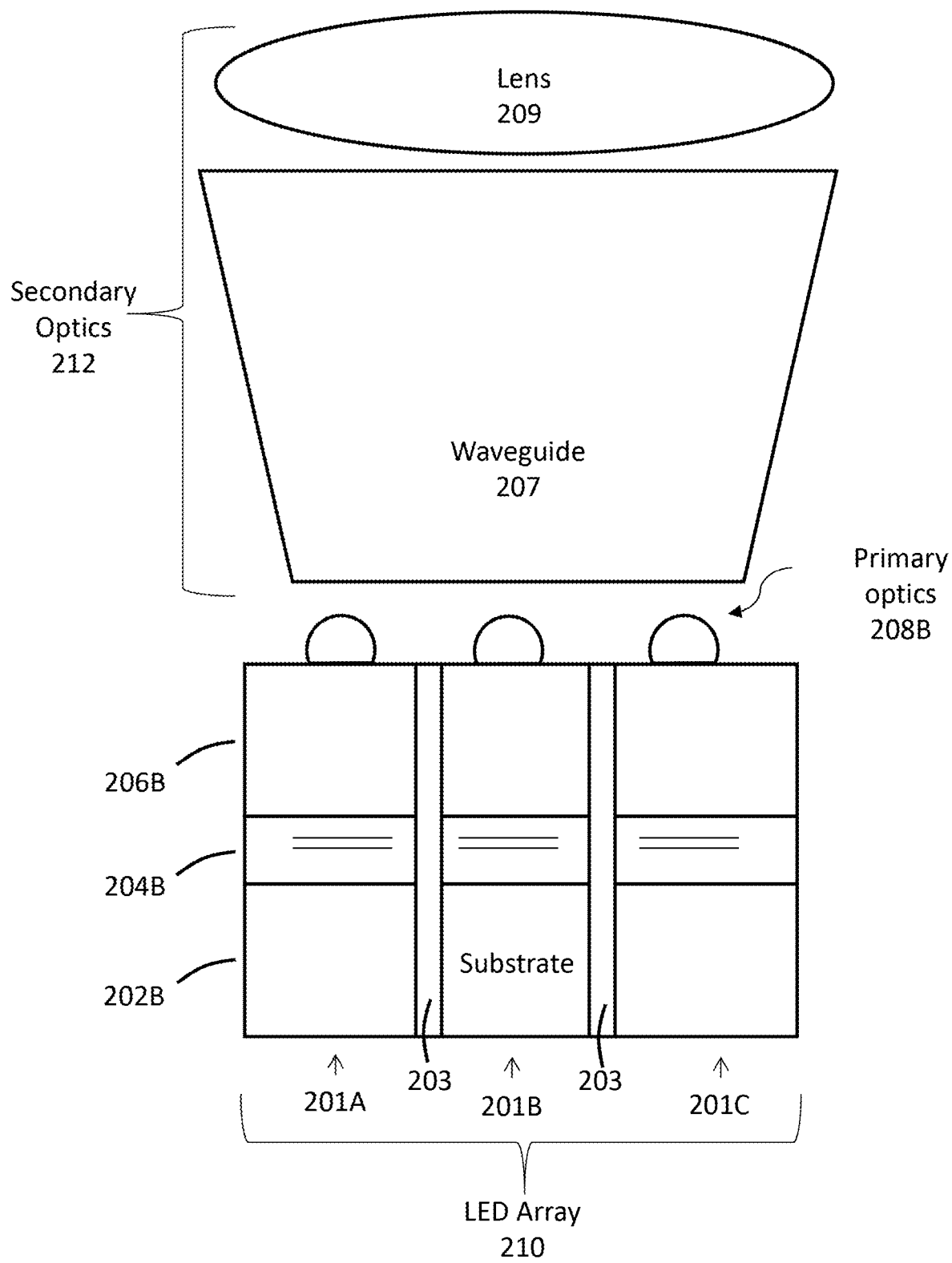
FIG. 2B is a diagram showing multiple LED devices.

FIG. 2B shows a cross-sectional view of a lighting system 220 including an LED array 210 with pixels 201A, 201B, and 201C, as well as secondary optics 212 in an example embodiment. The LED array 210 includes pixels 201A, 201B, and 201C each including a respective wavelength converting layer 206B active layer 204B and a substrate 202B. The LED array 210 may be a monolithic LED array manufactured using wafer level processing techniques, a micro LED with sub-500 micron dimensions, or the like. Pixels 201A, 201B, and 201C, in the LED array 210 may be formed using array segmentation, or alternatively using pick and place techniques.

The spaces 203 shown between one or more pixels 201A, 201B, and 201O of the LED devices 200B may include an air gap or may be filled by a material such as a metal material which may be a contact (e.g., n-contact).

The secondary optics 212 may include one or both of the lens 209 and waveguide 207. It will be understood that although secondary optics are discussed in accordance with the example shown, in example embodiments, the secondary optics 212 may be used to spread the incoming light (diverging optics), or to gather incoming light into a collimated beam (collimating optics). In example embodiments, the waveguide 207 may be a concentrator and may have any applicable shape to concentrate light such as a parabolic shape, cone shape, beveled shape, or the like. The waveguide 207 may be coated with a dielectric material, a metallization layer, or the like used to reflect or redirect incident light. In alternative embodiments, a lighting system may not include one or more of the following: the wavelength converting layer 206B, the primary optics 208B, the waveguide 207 and the lens 209.

Lens 209 may be formed form any applicable transparent material such as, but not limited to SiC, aluminum oxide, diamond, or the like or a combination thereof. Lens 209 may be used to modify the a beam of light input into the lens 209 such that an output beam from the lens 209 will efficiently meet a desired photometric specification. Additionally, lens 209 may serve one or more aesthetic purpose, such as by determining a lit and/or unlit appearance of the p 201A, 201B and/or 201C of the LED array 210.

Figure 3:
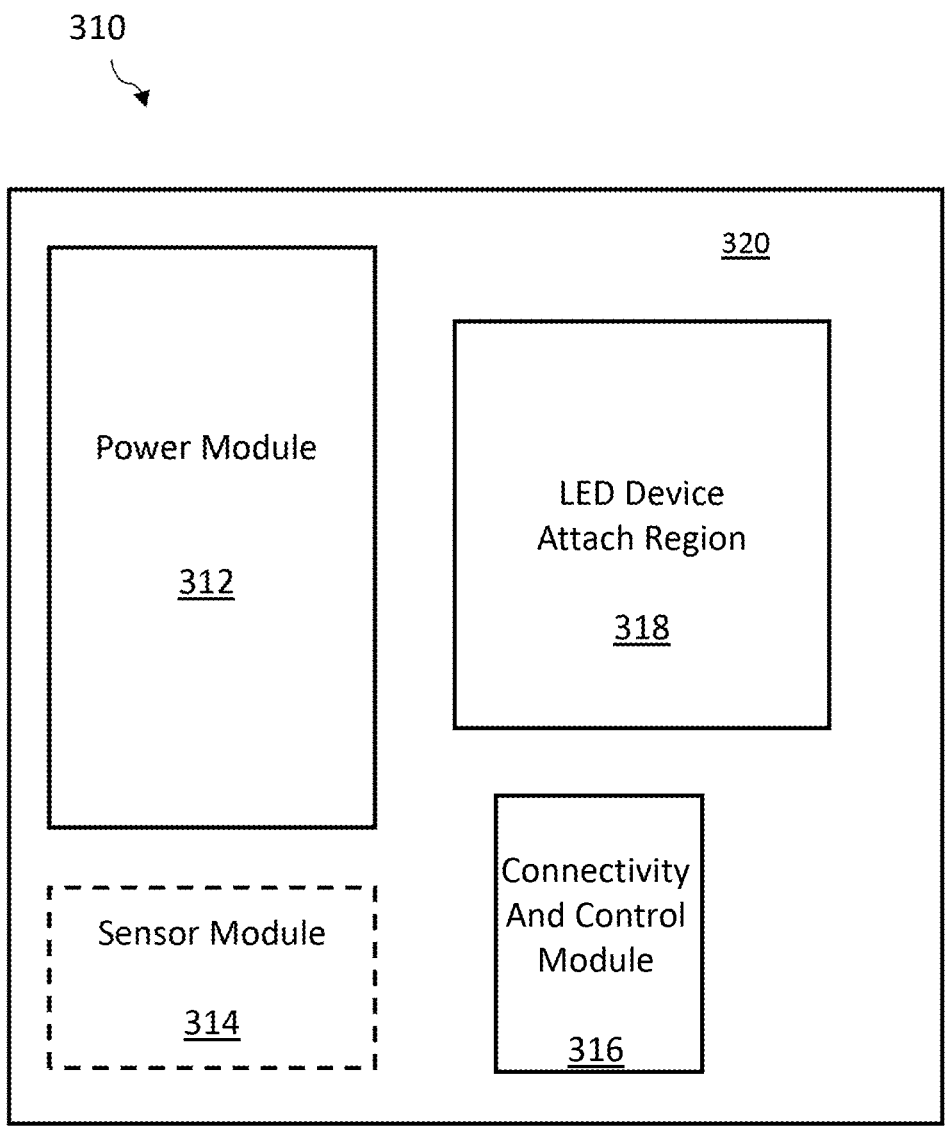
FIG. 3 is a top view of an electronics board for an integrated LED lighting system according to one embodiment.

FIG. 3 is a top view of an electronics board 310 for an integrated LED lighting system according to one embodiment. In alternative embodiments, two or more electronics boards may be used for the LED lighting system. For example, the LED array may be on a separate electronics board, or the sensor module may be on a separate electronics board. In the illustrated example, the electronics board 310 includes a power module 312, a sensor module 314, a connectivity and control module 316 and an LED attach region 318 reserved for attachment of an LED array to a substrate 320.

The substrate 320 may be any board capable of mechanically supporting, and providing electrical coupling to, electrical components, electronic components and/or electronic modules using conductive connecters, such as tracks, traces, pads, vias, and/or wires. The power module 312 may include electrical and/or electronic elements. In an example embodiment, the power module 312 includes an AC/DC conversion circuit, a DC/DC conversion circuit, a dimming circuit, and an LED driver circuit.

The sensor module 314 may include sensors needed for an application in which the LED array is to be implemented.

The connectivity and control module 316 may include the system microcontroller and any type of wired or wireless module configured to receive a control input from an external device.

The term module, as used herein, may refer to electrical and/or electronic components disposed on individual circuit boards that may be soldered to one or more electronics boards 310. The term module may, however, also refer to electrical and/or electronic components that provide similar functionality, but which may be individually soldered to one or more circuit boards in a same region or in different regions.

Figure 4A:
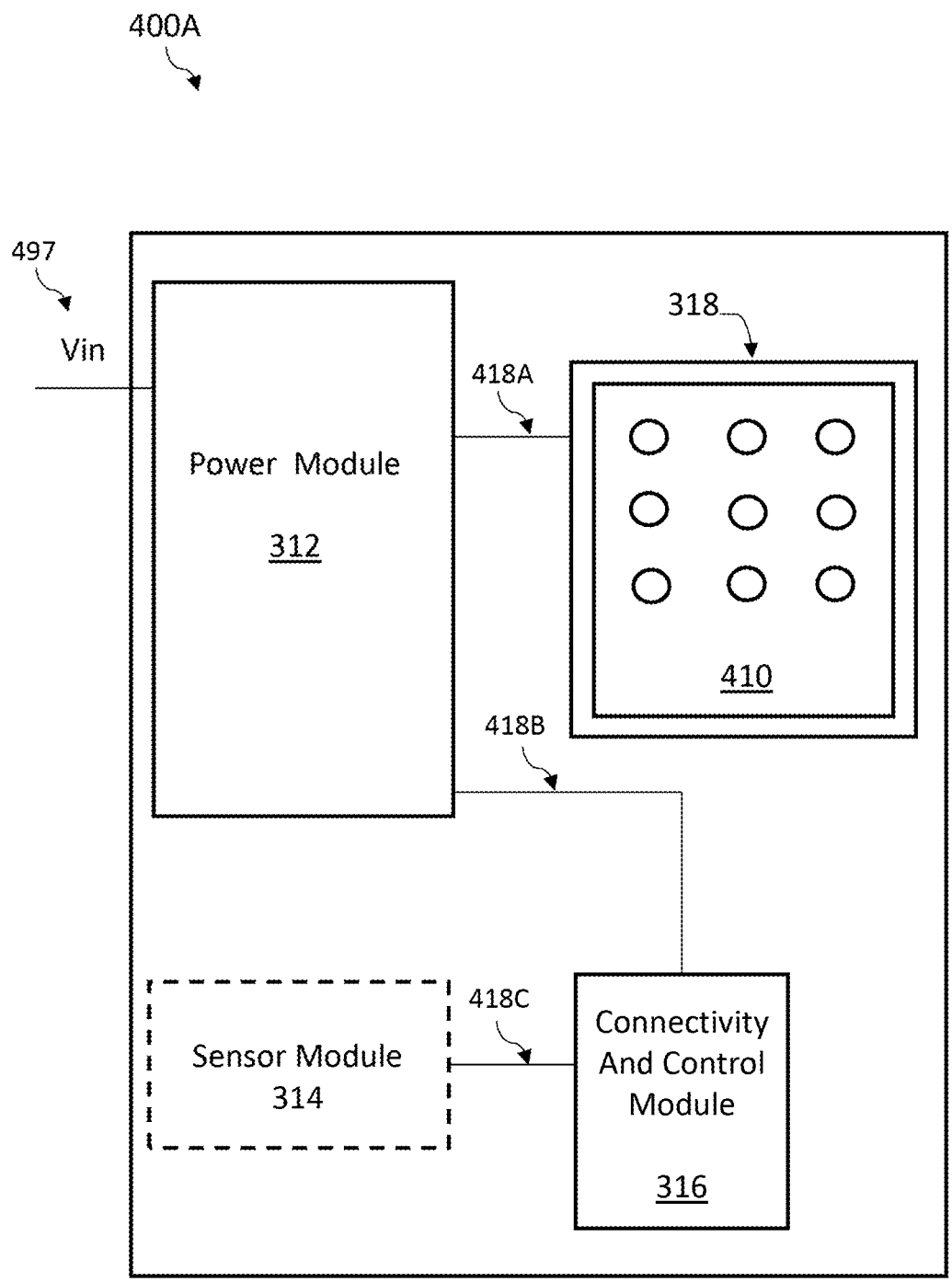
FIG. 4A is a top view of the electronics board with LED array attached to the substrate at the LED device attach region in one embodiment.

FIG. 4A is a top view of the electronics board 310 with an LED array 410 attached to the substrate 320 at the LED device attach region 318 in one embodiment. The electronics board 310 together with the LED array 410 represents an LED system 400A. Additionally, the power module 312 receives a voltage input at Vin 497 and control signals from the connectivity and control module 316 over traces 418B, and provides drive signals to the LED array 410 over traces 418A. The LED array 410 is turned on and off via the drive signals from the power module 312. In the embodiment shown in FIG. 4A, the connectivity and control module 316 receives sensor signals from the sensor module 314 over trace 418C.

Figure 4B:
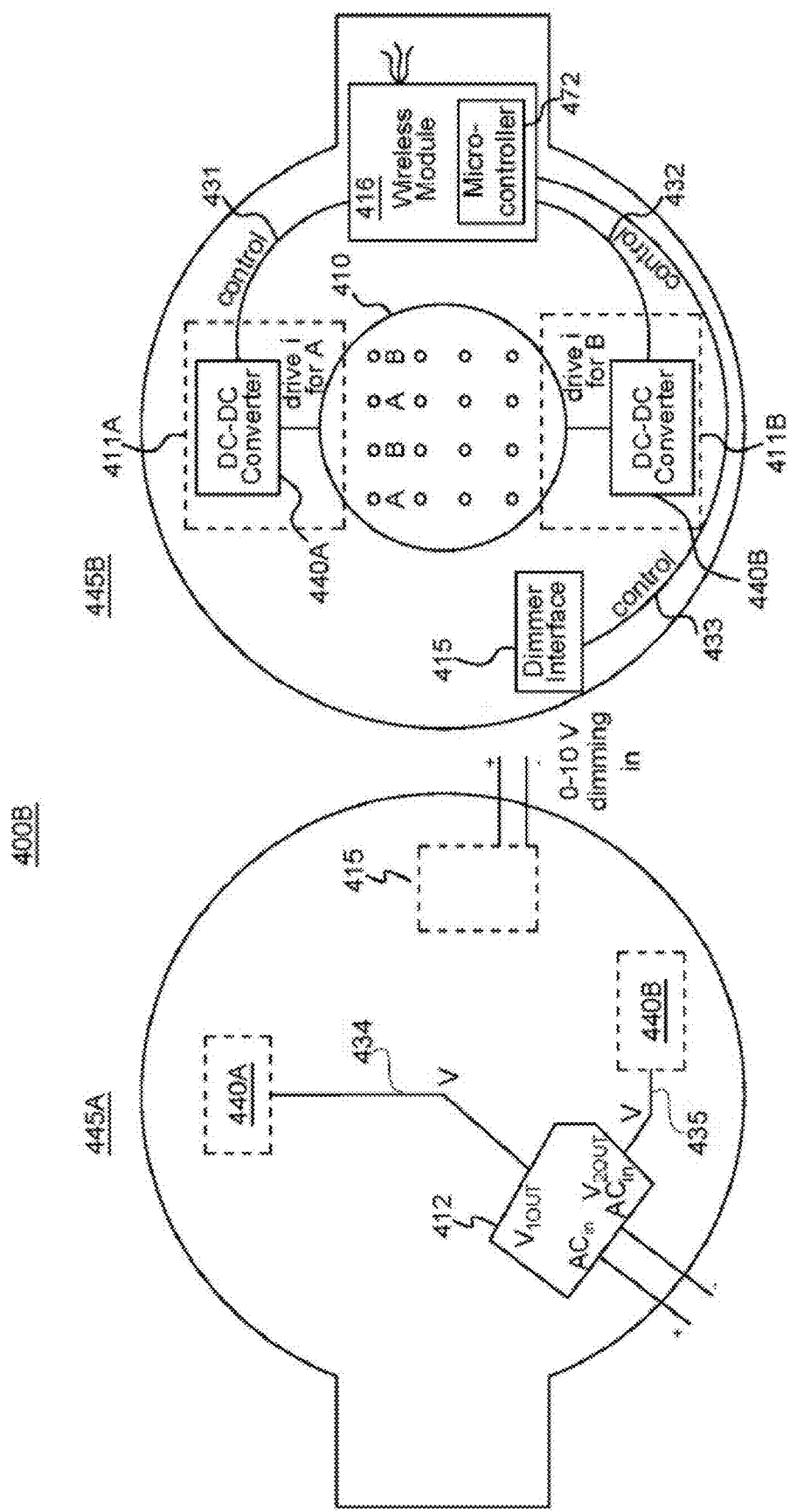
FIG. 4B is a diagram of one embodiment of a two channel integrated LED lighting system with electronic components mounted on two surfaces of a circuit board.

FIG. 4B illustrates one embodiment of a two channel integrated LED lighting system with electronic components mounted on two surfaces of a circuit board 499. As shown in FIG. 4B, an LED lighting system 400B includes a first surface 445A having inputs to receive dimmer signals and AC power signals and an AC/DC converter circuit 412 mounted on it. The LED system 400B includes a second surface 445B with the dimmer interface circuit 415, DC-DC converter circuits 440A and 440B, a connectivity and control module 416 (a wireless module in this example) having a microcontroller 472, and an LED array 410 mounted on it. The LED array 410 is driven by two independent channels 411A and 411B. In alternative embodiments, a single channel may be used to provide the drive signals to an LED array, or any number of multiple channels may be used to provide the drive signals to an LED array.

The LED array 410 may include two groups of LED devices. In an example embodiment, the LED devices of group A are electrically coupled to a first channel 411A and the LED devices of group B are electrically coupled to a second channel 411B. Each of the two DC-DC converters 440A and 440B may provide a respective drive current via single channels 411A and 411B, respectively, for driving a respective group of LEDs A and B in the LED array 410. The LEDs in one of the groups of LEDs may be configured to emit light having a different color point than the LEDs in the second group of LEDs. Control of the composite color point of light emitted by the LED array 410 may be tuned within a range by controlling the current and/or duty cycle applied by the individual DC/DC converter circuits 440A and 440B via a single channel 411A and 411B, respectively. Although the embodiment shown in FIG. 4B does not include a sensor module (as described in FIG. 3 and FIG. 4A), an alternative embodiment may include a sensor module.

The illustrated LED lighting system 400B is an integrated system in which the LED array 410 and the circuitry for operating the LED array 410 are provided on a single electronics board. Connections between modules on the same surface of the circuit board 499 may be electrically coupled for exchanging, for example, voltages, currents, and control signals between modules, by surface or sub-surface interconnections, such as traces 431, 432, 433, 434 and 435 or metallizations (not shown). Connections between modules on opposite surfaces of the circuit board 499 may be electrically coupled by through board interconnections, such as vias and metallizations (not shown).

According to embodiments, LED systems may be provided where an LED array is on a separate electronics board from the driver and control circuitry. According to other embodiments, a LED system may have the LED array together with some of the electronics on an electronics board separate from the driver circuit. For example, an LED system may include a power conversion module and an LED module located on a separate electronics board than the LED arrays.

According to embodiments, an LED system may include a multi-channel LED driver circuit. For example, an LED module may include embedded LED calibration and setting data and, for example, three groups of LEDs. One of ordinary skill in the art will recognize that any number of groups of LEDs may be used consistent with one or more applications. Individual LEDs within each group may be arranged in series or in parallel and the light having different color points may be provided. For example, warm white light may be provided by a first group of LEDs, a cool white light may be provided by a second group of LEDs, and a neutral white light may be provided by a third group.

Figure 5:
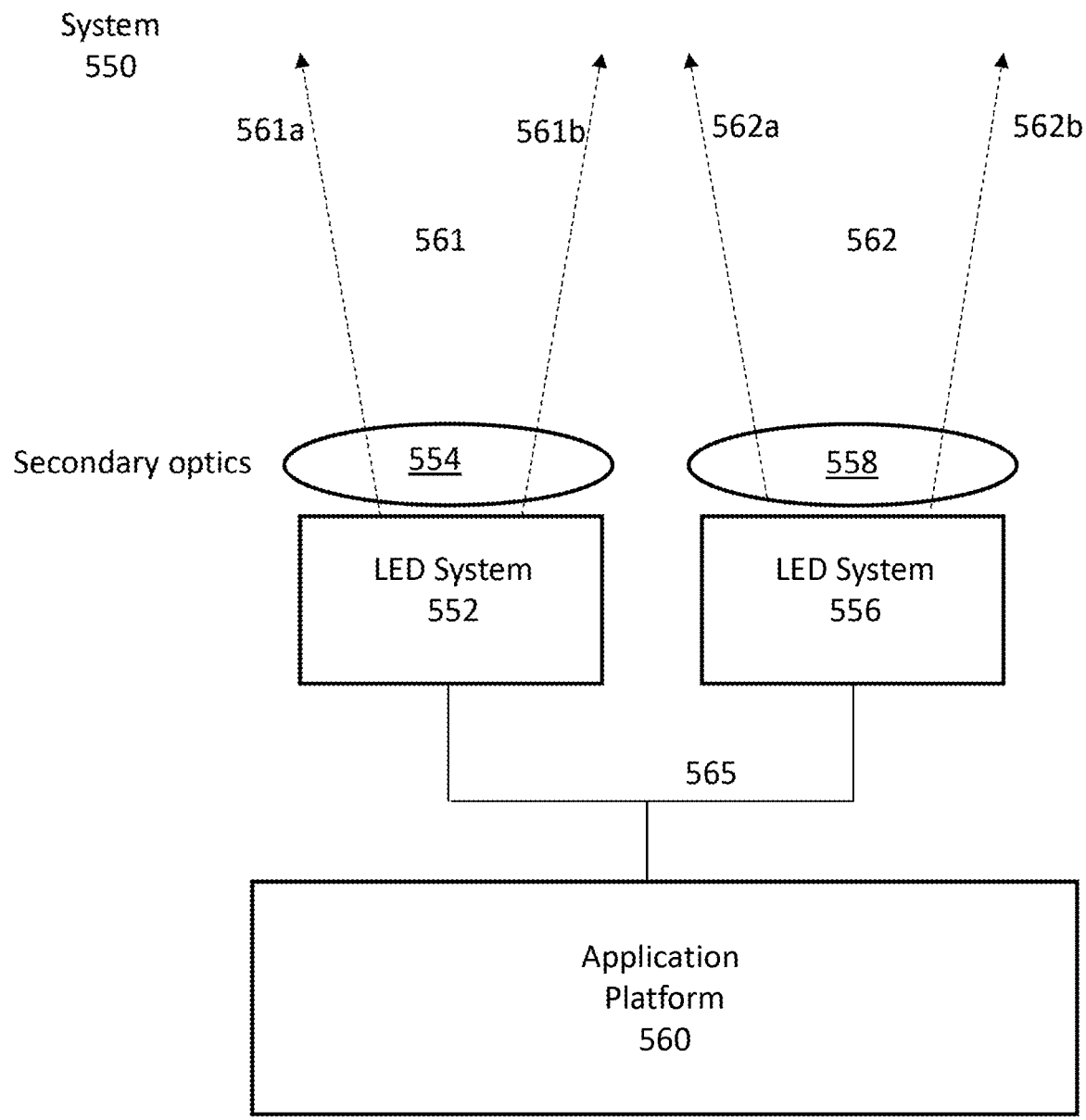
FIG. 5 is a diagram of an example application system.

FIG. 5 shows an example system 550 which includes an application platform 560, LED systems 552 and 556, and secondary optics 554 and 558. The LED System 552 produces light beams 561 shown between arrows 561a and 561b. The LED System 556 may produce light beams 562 between arrows 562a and 562b. In the embodiment shown in FIG. 5, the light emitted from LED system 552 passes through secondary optics 554, and the light emitted from the LED System 556 passes through secondary optics 558. In alternative embodiments, the light beams 561 and 562 do not pass through any secondary optics. The secondary optics may be or may include one or more light guides. The one or more light guides may be edge lit or may have an interior opening that defines an interior edge of the light guide. LED systems 552 and/or 556 may be inserted in the interior openings of the one or more light guides such that they inject light into the interior edge (interior opening light guide) or exterior edge (edge lit light guide) of the one or more light guides. LEDs in LED systems 552 and/or 556 may be arranged around the circumference of a base that is part of the light guide. According to an implementation, the base may be thermally conductive. According to an implementation, the base may be coupled to a heat-dissipating element that is disposed over the light guide. The heat-dissipating element may be arranged to receive heat generated by the LEDs via the thermally conductive base and dissipate the received heat. The one or more light guides may allow light emitted by LED systems 552 and 556 to be shaped in a desired manner such as, for example, with a gradient, a chamfered distribution, a narrow distribution, a wide distribution, an angular distribution, or the like.

In example embodiments, the system 550 may be a mobile phone of a camera flash system, indoor residential or commercial lighting, outdoor light such as street lighting, an automobile, a medical device, AR/VR devices, and robotic devices. The integrated LED lighting system shown in FIG. 3, LED System 400A shown in FIG. 4A, illustrate LED systems 552 and 556 in example embodiments.

In example embodiments, the system 550 may be a mobile phone of a camera flash system, indoor residential or commercial lighting, outdoor light such as street lighting, an automobile, a medical device, AR/VR devices, and robotic devices. The LED System 400A shown in FIG. 4A and LED System 400B shown in FIG. 4B illustrate LED systems 552 and 556 in example embodiments.

The application platform 560 may provide power to the LED systems 552 and/or 556 via a power bus via line 565 or other applicable input, as discussed herein. Further, application platform 560 may provide input signals via line 565 for the operation of the LED system 552 and LED system 556, which input may be based on a user input/preference, a sensed reading, a pre-programmed or autonomously determined output, or the like. One or more sensors may be internal or external to the housing of the application platform 560.

In various embodiments, application platform 560 sensors and/or LED system 552 and/or 556 sensors may collect data such as visual data (e.g., LIDAR data, IR data, data collected via a camera, etc.), audio data, distance based data, movement data, environmental data, or the like or a combination thereof. The data may be related a physical item or entity such as an object, an individual, a vehicle, etc. For example, sensing equipment may collect object proximity data for an ADAS/AV based application, which may prioritize the detection and subsequent action based on the detection of a physical item or entity. The data may be collected based on emitting an optical signal by, for example, LED system 552 and/or 556, such as an IR signal and collecting data based on the emitted optical signal. The data may be collected by a different component than the component that emits the optical signal for the data collection. Continuing the example, sensing equipment may be located on an automobile and may emit a beam using a vertical-cavity surface-emitting laser (VCSEL). The one or more sensors may sense a response to the emitted beam or any other applicable input.

In example embodiment, application platform 560 may represent an automobile and LED system 552 and LED system 556 may represent automobile headlights. In various embodiments, the system 550 may represent an automobile with steerable light beams where LEDs may be selectively activated to provide steerable light. For example, an array of LEDs may be used to define or project a shape or pattern or illuminate only selected sections of a roadway. In an example embodiment, Infrared cameras or detector pixels within LED systems 552 and/or 556 may be sensors that identify portions of a scene (roadway, pedestrian crossing, etc.) that require illumination.

Having described the embodiments in detail, those skilled in the art will appreciate that, given the present description, modifications may be made to the embodiments described herein without departing from the spirit of the inventive concept. Therefore, it is not intended that the scope of the invention be limited to the specific embodiments illustrated and described.

What is claimed is:

1. A light emitting diode (LED) comprising:
an electrically conductive via in a first portion of an epitaxial layer, the electrically conductive via filling a contact hole formed in the first portion;
a p-type contact on a second portion of the epitaxial layer, the first portion and the second portion separated by an isolation region having a length extending in a first direction, the isolation region and the electrically conductive via separated by the first portion of the epitaxial layer;
an n-type contact in the first portion of the epitaxial layer, the n-type contact directly coupled to the electrically conductive via; and
a transparent electrically conductive layer formed on the epitaxial layer and having a length extending in a second direction, the second direction substantially perpendicular to the first direction.

2. The LED of claim 1, wherein the epitaxial layer comprises:
an n-type layer;
an active region; and
a p-type layer.

3. The LED of claim 2, wherein the isolation region and the electrically conductive via extend through the p-type layer, the active region, and a portion of the n-type layer.

4. The LED of claim 2, wherein the transparent electrically conductive layer is on the n-type layer.

5. The LED of claim 2, wherein the p-type contact is directly on the p-type layer.

6. The LED of claim 1, wherein the second portion comprises a pixel.

7. The LED of claim 1, further comprising:
an insulating lining between the electrically conductive via and a portion of the epitaxial layer.

8. The LED of claim 1, wherein the isolation region has a width that is less than the length of the isolation region, and wherein the transparent electrically conductive layer has a width that is less than the length of the transparent electrically conductive layer.

9. A light emitting diode (LED) array comprising:
a first LED comprising an electrically conductive via that fills a contact hole formed in a first portion of an epitaxial layer, and a p-type contact on a second portion of the epitaxial layer, the first portion and the second portion separated by an isolation region having a length extending in a first direction, the isolation region and the electrically conductive via separated by the first portion of the epitaxial layer;
an n-type contact in the first portion of the epitaxial layer, the n-type contact directly coupled to the electrically conductive via; and a second LED comprising the epitaxial layer, the second LED electrically coupled to the first LED through a transparent electrically conductive layer on the n-type layer of the epitaxial layer, the transparent electrically conductive layer having a length that extends in a second direction, the second direction substantially perpendicular to the first direction, wherein the epitaxial layer comprises an n-type layer, an active region, and a p-type layer, wherein the isolation region and the electrically conductive via extend through the p-type layer, the active region, and a portion of the n-type layer, and wherein the first LED is separated from the second LED by a separation region.

10. The LED array of claim 9, wherein the p-type contact is directly on the p-type layer.

11. The LED array of claim 9, wherein the second portion comprises a first pixel.

12. The LED array of claim 9, wherein the second LED comprises a second pixel.

* * * * *